US005613077A

United States Patent [19]
Leung et al.

[11] Patent Number: 5,613,077
[45] Date of Patent: Mar. 18, 1997

[54] METHOD AND CIRCUIT FOR COMMUNICATION BETWEEN A MODULE AND A BUS CONTROLLER IN A WAFER-SCALE INTEGRATED CIRCUIT SYSTEM

[75] Inventors: Wing Y. Leung, Cupertino; Fu-Chieh Hsu, Saratoga, both of Calif.

[73] Assignee: Monolithic System Technology, Inc., Santa Clara County, Calif.

[21] Appl. No.: 307,496

[22] Filed: Sep. 14, 1994

Related U.S. Application Data

[63] Continuation of Ser. No. 927,564, Aug. 10, 1992, abandoned, which is a continuation-in-part of Ser. No. 865,410, Apr. 8, 1992, abandoned, which is a continuation-in-part of Ser. No. 787,984, Nov. 5, 1991, abandoned.

[51] Int. Cl.$^6$ .................................................. G06F 13/00
[52] U.S. Cl. .................... 395/306; 395/309; 395/280; 395/286; 395/182.01; 370/447; 375/219; 455/78
[58] Field of Search ................................. 395/325, 425, 395/275, 775, 200.02, 200.15, 280, 306, 182.01, 309, 286; 340/825.06; 377/77; 370/60, 94.1, 85.1; 364/488, 489; 375/219, 220; 455/78, 73

[56] References Cited

U.S. PATENT DOCUMENTS

| 3,585,378 | 5/1969 | Bouricius et al. | 371/51.1 |
|---|---|---|---|
| 3,651,473 | 3/1972 | Faber | 395/325 |
| 3,761,879 | 9/1973 | Brandsma et al. | 395/325 |

(List continued on next page.)

FOREIGN PATENT DOCUMENTS

| 0178949 | 4/1986 | European Pat. Off. |
|---|---|---|
| 0389203 | 9/1990 | European Pat. Off. |
| 59-212962 | 12/1984 | Japan . |
| WO-16680 | 10/1991 | WIPO . |
| WO93/18463 | 9/1993 | WIPO . |
| WO93/18462 | 9/1993 | WIPO . |
| WO93/18459 | 9/1993 | WIPO . |

OTHER PUBLICATIONS

IBM Technical Disclosure Bulletin, vol. 32, No. 4A, Oct. 1989, New York, pp. 423–425.
IBM Technical Disclosure Bulletin, vol. 32, No. 9A, Feb. 1990, New York, pp. 405–406.
Peter van Zant, *Microchip, A Practical Guide to Semiconductor Processing*, 1st Ed., Semiconductor Services, San Jose, CA, 1986, p. 8.
Yamashita, Koichi and Shohei Ikehara, "A Design and Yield Evaluation Technique for Wafer–Scale Memory," IEEE Trans Jnl, Apr. 1992, pp. 19–27.

(List continued on next page.)

*Primary Examiner*—Gopal C. Ray
*Attorney, Agent, or Firm*—Skjerven, Morrill, MacPherson, Franklin & Friel; Norman R. Klivans; E. Eric Hoffman

[57] ABSTRACT

A fault-tolerant, high-speed wafer scale system comprises a plurality of functional modules, a parallel hierarchical bus which is fault-tolerant to defects in an interconnect network, and one or more bus masters. This bus includes a plurality of bus lines segmented into sections and linked together by programmable bus switches and bus transceivers or repeaters in an interconnect network. By: 1) use of small block size (512K bit) for the memory modules; 2) use of programmable identification register to facilitate dynamic address mapping and relatively easy incorporation of global redundancy; 3) Use of a grid structure for the bus to provide global redundancy for the interconnect network; 4) Use of a relatively narrow bus consisting of 13 signal lines to keep the total area occupied by the bus small; 5) Use of segmented bus lines connected by programmable switches and of bus defects; 6) use of special circuit for bus transceivers and asynchronous handshakes to facilitate dynamic bus configuration; 7) use of programmable control register to facilitate run-time bus reconfiguration; 8) Use of spare bus lines to provide local redundancy for the bus; and 9) Use of spare rows and columns in the memory module to provide local redundancy, high defect tolerance in the hierarchical bus is obtained.

34 Claims, 19 Drawing Sheets

U.S. PATENT DOCUMENTS

| | | | |
|---|---|---|---|
| 3,803,562 | 4/1974 | Hunter | 365/200 |
| 3,849,872 | 11/1974 | Hubacher | 257/50 |
| 3,983,537 | 9/1976 | Parsons et al. | 395/425 |
| 4,007,452 | 2/1977 | Hoff, Jr. | 340/173 |
| 4,038,648 | 7/1977 | Chesley | 340/173 |
| 4,063,225 | 12/1977 | Stewart | 365/156 |
| 4,071,887 | 1/1978 | Daly et al. | 364/200 |
| 4,092,733 | 5/1978 | Coontz et al. | 365/200 |
| 4,132,869 | 1/1979 | Knox | 179/18 |
| 4,188,670 | 2/1980 | Hsia | 365/49 |
| 4,215,430 | 7/1980 | Johnson, Jr. | 375/362 |
| 4,227,045 | 10/1980 | Chelcun et al. | 178/66.1 |
| 4,319,356 | 3/1982 | Kocol et al. | 371/37.3 |
| 4,329,685 | 5/1982 | Mahon et al. | 340/825.84 |
| 4,355,387 | 10/1982 | Portejoie et al. | 370/102 |
| 4,379,327 | 4/1983 | Tietjen et al. | 364/200 |
| 4,400,794 | 8/1983 | Koos | 395/400 |
| 4,407,014 | 9/1983 | Holtey et al. | 395/550 |
| 4,458,297 | 7/1984 | Stopper et al. | 361/403 |
| 4,467,400 | 8/1984 | Stopper | 361/403 |
| 4,494,196 | 1/1985 | Greer | 364/200 |
| 4,605,928 | 8/1986 | Georgiou | 340/825.94 |
| 4,615,017 | 9/1986 | Finlay et al. | 364/900 |
| 4,627,058 | 12/1986 | Moriyama | 371/37.1 |
| 4,630,355 | 12/1986 | Johnson | 29/575 |
| 4,637,073 | 1/1987 | Selin et al. | 455/78 |
| 4,639,861 | 1/1987 | Appiano et al. | 364/200 |
| 4,639,933 | 1/1987 | Howell et al. | 375/321 |
| 4,646,298 | 2/1987 | Laws et al. | 371/16.1 |
| 4,649,384 | 3/1987 | Sheafor et al. | 340/825.03 |
| 4,653,050 | 3/1987 | Vaillancourt | 371/10 |
| 4,663,758 | 5/1987 | Lambarelli et al. | 370/85.1 |
| 4,667,328 | 5/1987 | Imran | 371/61 |
| 4,680,780 | 7/1987 | Agoston et al. | 375/121 |
| 4,703,436 | 10/1987 | Varshney | 364/490 |
| 4,707,808 | 11/1987 | Heimbigner | 365/182 |
| 4,719,621 | 1/1988 | May | 370/85 |
| 4,736,365 | 4/1988 | Stern | 370/85 |
| 4,823,363 | 4/1989 | Yoshida | 375/120 |
| 4,847,615 | 7/1989 | McDonald | 340/825 |
| 4,866,508 | 9/1989 | Eichelberger et al. | 357/74 |
| 4,872,137 | 10/1989 | Jennings, III | 377/70 |
| 4,876,700 | 10/1989 | Grindahl | 375/87 |
| 4,881,232 | 11/1989 | Sako et al. | 371/37.4 |
| 4,890,224 | 12/1989 | Fremont | 364/200 |
| 4,906,987 | 3/1990 | Venaleck et al. | 340/825.83 |
| 4,912,633 | 3/1990 | Schweizer et al. | 364/200 |
| 4,926,382 | 5/1990 | Sakui et al. | 365/203 |
| 4,943,914 | 7/1990 | Kubo | 395/425 |
| 4,943,966 | 7/1990 | Giunta et al. | 371/11.1 |
| 4,955,020 | 9/1990 | Stone et al. | 370/85.9 |
| 4,970,724 | 11/1990 | Yung | 371/9.1 |
| 4,974,048 | 11/1990 | Chakravorty et al. | 357/40 |
| 4,980,765 | 12/1990 | Kudo et al. | 358/160 |
| 4,984,192 | 1/1991 | Flynn | 395/800 |
| 4,985,895 | 1/1991 | Pelkey | 371/37.7 |
| 5,001,712 | 3/1991 | Splett et al. | 371/1 |
| 5,020,020 | 5/1991 | Pomfret et al. | 364/900 |
| 5,021,985 | 6/1991 | Hu et al. | 364/748 |
| 5,043,820 | 8/1991 | Wyles et al. | 358/213 |
| 5,045,725 | 9/1991 | Sasaki et al. | 307/465 |
| 5,055,897 | 10/1991 | Canepa et al. | 357/23.5 |
| 5,077,596 | 12/1991 | Inoue | 357/41 |
| 5,077,737 | 12/1991 | Leger et al. | 371/10.1 |
| 5,077,738 | 12/1991 | Larsen et al. | 371/15.1 |
| 5,103,424 | 4/1992 | Wade | 365/200 |
| 5,111,271 | 5/1992 | Hatada et al. | 357/45 |
| 5,111,434 | 5/1992 | Cho | 365/207 |
| 5,118,975 | 6/1992 | Hillis et al. | 307/602 |
| 5,125,006 | 6/1992 | Morinaro | 375/219 |
| 5,128,737 | 7/1992 | van der Have | 357/40 |
| 5,131,015 | 7/1992 | Benjaram et al. | 375/121 |
| 5,133,064 | 7/1992 | Hotta et al. | 395/550 |
| 5,159,273 | 10/1992 | Wright et al. | 324/537 |
| 5,161,152 | 11/1992 | Czerwiec et al. | 370/84 |
| 5,187,779 | 2/1993 | Jeddeloh et al. | 395/325 |
| 5,204,836 | 4/1993 | Reed | 365/200 |
| 5,206,832 | 4/1993 | Yamaguchi et al. | 365/230.02 |
| 5,214,657 | 5/1993 | Farnworth et al. | 371/40.1 |
| 5,218,686 | 6/1993 | Thayer | 395/425 |
| 5,243,623 | 9/1993 | Murdock | 375/220 |
| 5,243,703 | 9/1993 | Farmwald et al. | 395/325 |
| 5,247,522 | 9/1993 | Reiff | 371/29.5 |
| 5,252,507 | 10/1993 | Hively et al. | 437/51 |
| 5,254,883 | 10/1993 | Horowitz et al. | 307/443 |
| 5,261,077 | 11/1993 | Duval et al. | 395/500 |
| 5,265,216 | 11/1993 | Murphy et al. | 395/325 |
| 5,268,639 | 12/1993 | Gasbarro et al. | 324/158 R |
| 5,278,967 | 1/1994 | Curran | 395/425 |
| 5,329,174 | 7/1994 | Chiang | 307/443 |
| 5,329,559 | 7/1994 | Wong et al. | 375/119 |
| 5,379,258 | 1/1995 | Murakami et al. | 365/200 |
| 5,402,388 | 3/1995 | Wojcicki et al. | 365/233 |
| 5,434,996 | 7/1995 | Bell | 395/550 |

OTHER PUBLICATIONS

Horst, Robert W., "Task–Flow Architecture for WSI Parallel Processing," IEEE Trans Jnl, Apr. 1992, pp. 10–18.

Takai et al., "250 Mbyte/s Synchronous DRAM Using a 3–Stage–Pipelined Architecture," IEEE Jnl of Solid–State circuits, vol. 29, No. 4, Apr., 1994, pp. 426–431.

Fujii, et al., "A 50–µA Standby 1M×1/256K×4 CMOS DRAM with High–Speed Sense Amplifier," IEEE Jnl of Solid–State Circuits, vol. SC–21, No. 5, Oct., 1986, pp. 643–647.

"32K×9 Bit BurstRAM™ Synchronous Static RAM With Burst Counter and Self–timed Write," *Motorola Memory Data*, pp. 7–100 to 7–109.

Rhodes et al., "A Monolithic Hough Transform Processor Based on Restructurable VLSI," IEEE Trans. on Pattern Analysis and Machine Intelligence, vol. 1, pp. 106–110.

Ganapathy et al., "Yield Optimization in Large RAM's with Hierachical Redundancy," IEEE Jnl of Solid–State Circuits, vol. 26, No. 9, Sep., 1991, pp. 1259–1269.

Aubusson, Russell C. and Ivor Catt, "Wafer–Scale Integration—A Fault–Tolerant Procedure," IEEE Jnl of Solid State Circuits, vol. SC–13, No. 3, Jun., 1978, pp. 339–344.

Stodieck, Robert, "Designing With the IDT49C460 and IDT39C60 Error Detection and Correction Units," Application Note AN–24 by IDT, 1989, pp. 1–10.

Antola et al., "Reconfiguration of Binary Trees: The Flow–Driven Approach," 1991 International Conference on Wafer Scale Integration, 1991, pp. 141–147.

Shi, Weiping and W. Kent Fuchs, "Large Area Defect–Tolerant Tree Architectures," 1991 International Conference on Wafer Scale Integration, 1991, pp. 127–133.

MacDonald et al., "Dynamic RAMs 200mb Wafer Memory" IEEE ISSCC, Feb. 17, 1989, pp. 240–241 and 350.

Cavil et al., "Wafer–Scale Integration," Microelectronics Manufacturing Technology, May, 1991, pp. 55–59.

Herbert Stopper, "Wafer–Scale Integration," Hybrids and High–Level Integration, pp. 354–364.

"A Design and Yield Evaluation Technique for Wafer–Scale Memory", Apr. 1992, Yamashita et al., Fujitsu.

"Task–Flow Architecture for WSI Parallel Processing,", Apr. 1992, Robert W. Horst, Tandem Computers Inc.

"A Monolithic Hough Transform Processor Based on Restructurable VLSI", Rhodes et al., Jan. 1988.

"Yield Optimization in Large RAM's with Hierarchical Redundancy", Ganapathy et al., Sep. 1991.

"Wafer–Scale Integration—A Fault–Tolerance Procedure", Aubusson et al., Jun. 1978.

"Designing With the IDT49C460 and IDT39C60 Error Detection and Correction Units", Stodieck, Jan. 1989.

"Reconfiguration of Binary Trees: The Flow–Driven Approach" Antola et al., 1991.

"Large Area Defect–Tolerant Tree Architectures", Shi et al., 1991.

Group 1 - Block - mode transfer signals
- Bus Data [0:8]
- Clk

Group 2 - Asynchronous control signals
- Bus Busy (BB#)
- Transmit / Receive (T / R)
- TriState Control (TC#)

| BB# | T/R | TC# | BUS STATE |
|---|---|---|---|
| 0 | 0 | 0 | Hi Z |
| 0 | 0 | 1 | Receive |
| 0 | 1 | 0 | Hi Z |
| 0 | 1 | 1 | Transmit |
| 1 | 0 | 0 | Idle |
| 1 | 0 | 1 | Idle |
| 1 | 1 | 0 | Idle |
| 1 | 1 | 1 | Idle |

FIG. 5

| BIT LOCATION | 0 | 7 | 8 |
|---|---|---|---|
| BYTE 0 | $D_0$ | $D_7$ | $ED_0$ |
| BYTE 1 | $D_8$ | $D_9$ | $ED_1$ |
| ⋮ | ⋮ | ⋮ | ⋮ |
| BYTE 8 | $D_{56}$ | $D_{63}$ | $ED_7$ |

DATA — EDC CODE

FIG. 9

MBI = Memory Bus Interface

METHOD AND CIRCUIT FOR COMMUNICATION BETWEEN A MODULE AND A BUS CONTROLLER IN A WAFER-SCALE INTEGRATED CIRCUIT SYSTEM

CROSS-REFERENCE TO RELATED APPLICATIONS

This application is a continuation of application Ser. No. 07/927,564, filed Aug. 10, 1992, abandoned, which is a continuation-in-part of Ser. No. 07/865,410, filed Apr. 8, 1992, abandoned, which is a continuation-in-part of Ser. No. 07/787,984, filed Nov. 5, 1991, abandoned.

BACKGROUND OF THE INVENTION

1. Field of the Invention

The present invention generally relates to wafer-scale circuit integration, in particular to a wafer-scale integrated circuit system comprising data processing elements partitioned into modules, a parallel high-speed hierarchical bus, and one or more bus masters which control the bus operation, bus and a bus interface thereof.

2. Description of the Prior Art

Wafer-scale integration provides more transistors in a single large chip, which allows more functions to be integrated in a small printed circuit board area. Systems built with wafer-scale integration therefore have higher performance, higher reliability and lower cost.

The major barrier to a successful wafer-scale system has been defects inherent in the fabrication process which may render a substantial part of or the whole system nonfunctional. Therefore, it is important to have an effective defect tolerant scheme which allows the overall system to function despite failure of some of its functional blocks. One effective way to manage defects is to partition the wafer-scale system into identical small blocks so that defective blocks can be eliminated. The area of each block is usually made small so that the overall block yield is high. If the number of defective blocks is small, the performance of the system as a whole is not substantially affected. The blocks are in general connected together by an interconnect network which provides communication links between each block and the outside. Since the blocks are usually small, information processing within each block is relatively fast and the overall system performance is largely determined by the performance (bandwidth and latency) of the network. Since the network may extend over the entire wafer, its total area is significant and it is highly susceptible to defects. Therefore, it is important for the network to be highly tolerant to defects. Traditionally, high communication performance and defect tolerance are conflicting requirements on the network. High communication performance, such as short latency and high bandwidth, requires large numbers of parallel lines in the network which occupy a large area, making it more susceptible to defects.

By limiting the direct connection to be between neighboring blocks only, a serial bus system offers high defect tolerance and simplicity in bus configuration. Systems using a serial bus are described, for instance, in R. W. Horst, *"Task-Flow Architecture,"* IEEE Computer, Vol. 25, No. 4, April 1992, pp. 10–18; McDonald U.S. Pat. No. 4,847,615, and R. C. Aubusson et al, *"Wafer-scale Integration—A Fault-tolerant Procedure,"* IEEE ISCC, Vol. SC-13, No. 3, June 1988, pp. 339–344. These systems have the capability of self configuration and are highly tolerant to defects. However, they inherit the disadvantage of a serial bus and suffer from long access latency because the communication signals have to be relayed from one block to another down the serial bus.

A parallel bus system offers direct connections between all the communicating devices and provides the shortest communication latency. However, a parallel bus system without reconfiguration capability offers the lowest defect tolerance since any defect on the bus can render a substantial part of the system without communication link. Known systems implement parallel bus with limited success. In U.S. Pat. No. 4,038,648 [Chesley] a parallel bus connected to all circuit module is used to transfer address and control information, no defect management is provided for the parallel bus. In U.S. Pat. No. 4,007,452 [Hoff, Jr.], a two-level hierarchical bus is used to transfer multiplexed data and address in a wafer-scale memory. Without redundancy and reconfiguration capability in the bus, harvest rate is relatively low, because defects in the main bus can still cause failure in a substantial part of the system. In both these systems, a separate serial bus is used to set the communication address of each functional module. In each scheme, a defect management different from that used in the parallel bus is required in the serial bus. This complicates the overall defect management of the system as a whole and increases the total interconnect overhead.

Many known systems use a tree-structure in their bus. By reducing the number of blocks the bus signals have to travel through, buses with tree structures offer higher communication speed than those with linear or serial structure.

In K. N. Ganapathy, et al, *"Yield Optimization in Large RAMs with Hierarchical Redundancy,"* IEEE JSSC, vol. 26, No. 9, 1991, pp. 1259–1264, a wafer-scale memory using a binary-tree bus is described. The scheme uses separate bus lines for address and data. Address decoding is distributed among the tree nodes in the bus. The separation of address and data buses increases the bus overhead and complicates the defect management.

SUMMARY OF THE INVENTION

Accordingly, one object of this invention is to provide a high-speed interface in the module so that large amounts of data can be transferred between the module and the bus masters.

Another object of this invention is to provide a method for disabling defective modules so that they have little effect on the rest of the system.

Another object of this invention is to provide a method for changing the communication address of a module when the system is in operation. The technique facilitates dynamic address mapping and provides run-time fault tolerance to the system.

Another object of this invention is to provide programmability in the bus transceivers so that the bus network can be dynamically reconfigured.

In accordance with the present invention, a plurality of functional modules is connected to one or more bus masters through a parallel hierarchical bus in a interconnect network. This bus includes a plurality of bus lines segmented into sections and linked together by programmable bus switches and bus transceivers or repeaters in the interconnect network.

The bus transceiver in accordance with the present invention includes a plurality of bidirectional, tri-state buffers selectively buffering signals in each bus line along a selected direction, and a control unit selectively tri-stating the bus transceiver and controlling the direction along which the signals are buffered. The bus transceiver can further include a disable circuit disabling the bus transceiver thereby isolating it from two bus segments. According to the present invention, each bi-directional, tri-state buffer has a propagation delay shorter than the input-to-output delay of the control unit.

In accordance with the present invention, the parallel hierarchical bus includes a set of signal lines and a set of control lines. Bus control signals are asynchronously transferred through the control lines while data, address and timing information are source-synchronously block or packet transferred through the signal lines. The source-synchronous scheme allows modules to communicate at different frequencies and increases the overall yield of the system as it can accommodate both slow and fast memory devices without sacrificing the performance of the fast devices. It also frees the system of the burden of implementing a global clock synchronization which in general consumes a relatively large amount of power and is difficult to achieve high synchronization accurately in a wafer-scale or large chip environment. The asynchronous handshakes allow control of states of the bus and dynamic configuration. Two kinds of block transfer mode are implemented in accordance with the present invention. The broadcasting mode allows the controller to send command message to all modules while point-to-point mode allows only one module at a time to communicate with the controller and only a portion of the bus communicating directly between the communicating module and the controller being activated. Consequently, the portion of the bus not connecting therebetween is in high-impedance state.

In accordance with the present invention, a high speed interface in a memory module includes bus drivers buffering signals to or from the memory bus, two first-in first-out memory elements to match communication bandwidth between the hierarchical memory bus and the internal bus of the memory module. In one embodiment the bus interface further includes a plurality of raw address registers holding row addresses for each of the memory block whose content is being cached by the sense amplifier, a column address register holding a base address for the current cache access, and three control registers for selecting a communicating module and activating or deactivating the module.

High defect tolerance in the hierarchical bus is obtained using the following techniques: 1) Use of relatively small block size (512K bit or 588K bit with parity) for the memory modules; 2) Use of programmable identification register to facilitate dynamic address mapping and relatively easy incorporation of global redundancy; 3) Use of a grid structure for the bus to provide global redundancy for the interconnect network; 4) Use of a relatively narrow bus consisting of 13 signal lines to keep the total area occupied by the bus small; 5) Use of segmented bus lines connected by programmable switches and programmable bus transceivers to facilitate easy isolation of bus defects; 6) Use of special circuit for bus transceivers and asynchronous handshakes to facilitate dynamic bus configuration; 7) Use of programmable control register to facilitate run-time bus reconfiguration; 8) Use of spare bus lines to provide local redundancy for the bus; and 9) Use of spare rows and columns in the memory module to provide local redundancy.

BRIEF DESCRIPTION OF THE DRAWINGS

FIG. 5 is a truth table defining the bus states.

FIG. 9 shows the field definitions of a data packet with EDC code.

FIG. 17 consisting of FIGS. 17(a)–17(e) shows the schematic of a bus transceiver.

FIG. 18 consisting of FIGS. 18(i a)–18(g) shows diagrams showing the reconfiguration of the bus network using the programmability in the bus transceivers.

DETAILED DESCRIPTION OF THE INVENTION

Figure 1:
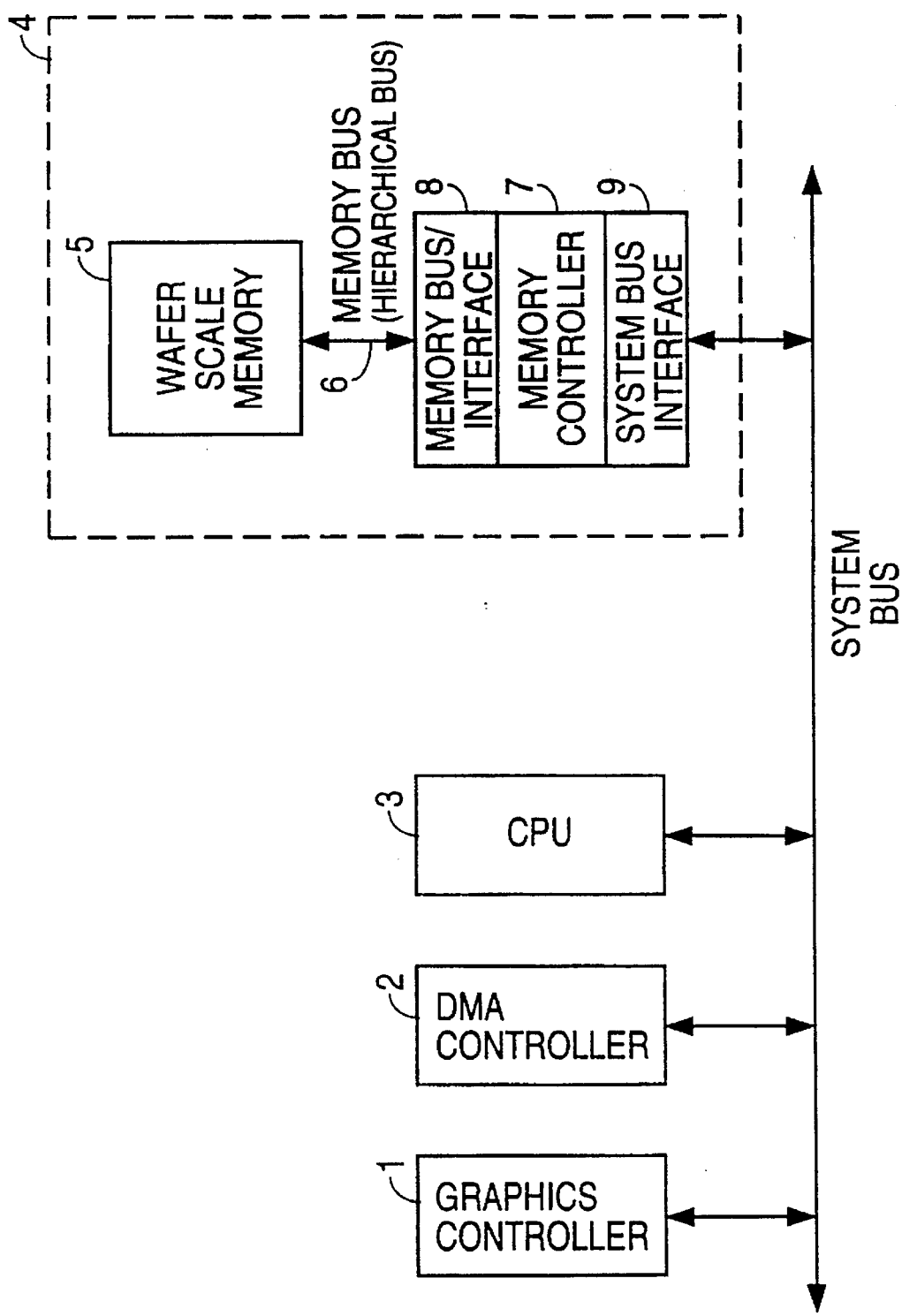
FIG. 1 is a block diagram of a digital system in accordance with the present invention as a memory subsystem.

As illustrated in FIG. 1, a memory sub-system according to the present invention is used in a digital system, which consists of a wafer scale memory 5, hierarchical memory bus 6 and a memory controller 7. The memory controller 7 controls memory access and comprises a memory bus interface 8 for communicating to the hierarchical bus 6, and a system bus interface 9 for communicating to the system bus 10. The system bus 10 connects the memory subsystem to the memory request devices which are CPU 3, DMA controller 2 and graphics controller 1.

Figure 2:
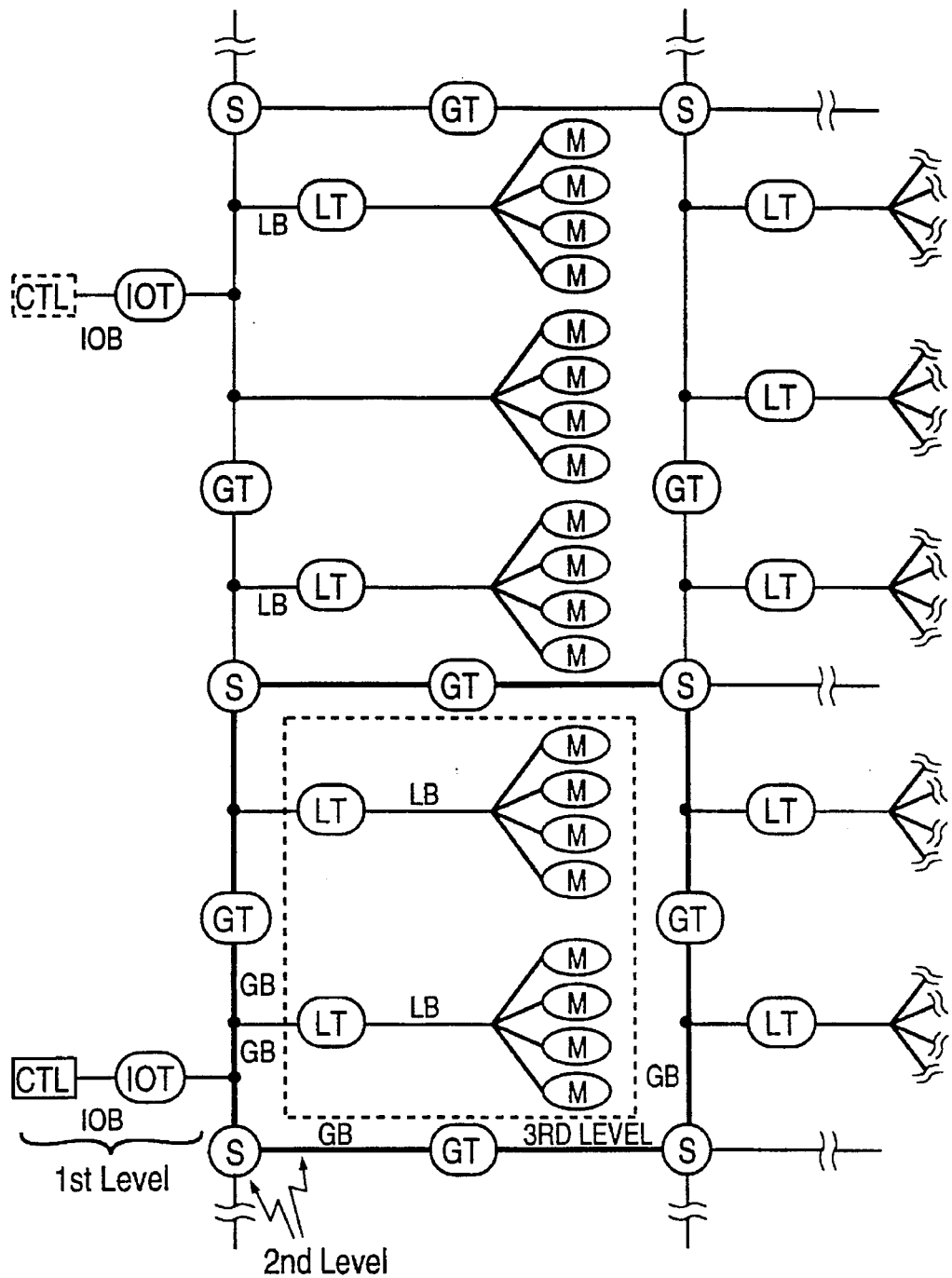
FIG. 2 is a diagram showing the hierarchical structure of the bus.

The bus has a hierarchical structure which can be distinguished into 3 levels. As illustrated in FIG. 2, the first level or the root level has a few branches (IOB) for connecting the memory controller to the second level. In most cases, only one branch is used for the connection, unless multiple controllers are used, the other branches are used for spares. The root branches (IOB) are connected to the second level through the input-output transceivers (IOT). In the third level, the bus is arranged into quad trees with four memory modules connecting to one local bus transceiver (LT) through the local bus interconnect (LB). In the second level, the bus is divided into bus segments (GB) arranged into grids joined together by bus transceivers (GT) and bus switches (S). One of the bus grids is high-lighted with thicker lines in FIG. 2. The second level bus or the global bus forms the backbone of the communication network. In a system with many memory modules, loading on the global bus can be relatively heavy. To facilitate high frequency communications, bus repeaters or transceivers are inserted periodically to restore signal quality. By structuring the bus into a hierarchy of three levels, loading on the global bus imposed by the memory modules is decreased, in this case, by four times. In addition, loading from the global bus is shielded from the controller by the input-output transceiver (IOT). The grid structure interlaced with bus repeaters allows flexible bus configuration for high defect-tolerance while maintaining high-frequency bus transfers and low communication latency.

The bus transceivers IOT, GT and LT, all use the same circuit structure. Each transceiver is incorporated with a control register which can be programmed to set the transceiver into the high impedance (HiZ) state in which the two bus segments connecting to the transceiver are electrically isolated from each other. Defective bus segments can be isolated from the rest of the bus by setting the transceivers connecting to them to HiZ state. Fuses or programmable switches (not shown for clarity) are used to connect the transceivers to the bus segments. The fuses or switches can be used to isolate the transceivers from the bus in case of defects on the transceivers.

Figures 3, 4:
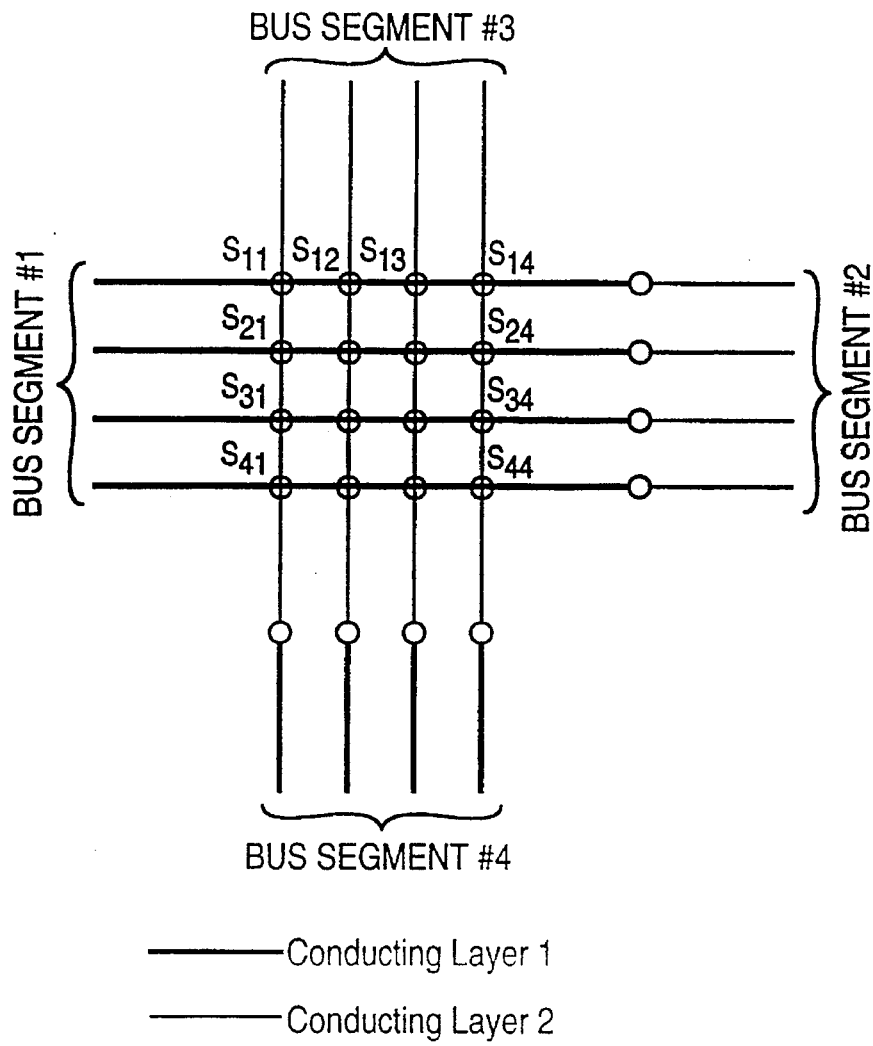
FIG. 3 is a diagram showing the structure of a cross-bar switch used in the hierarchical bus.
FIG. 4 is a table defining the bus signals.

The bus switches provide another (optional) means for flexible bus configuration. As illustrated in FIG. 3, the cross-bar switch consists of an array of anti-fuses S11 to S44 overlying four sets of bus segments 1 to 4. For clarity, only four bus signals are shown. When programmed, an anti-fuse provides a low resistance connection between the two lines it intersects. In its "virgin" or preprogrammed state, the cross-bar switch separates the four bus segments 1,2,3,4, from one another. When programmed, the cross-bar switch allows the bus segments to be selectively joined together. Detailed structure of a cross-bar switch used in accordance with the present invention is described in a co-pending and related patent application entitled "Circuit module redundancy architecture," filed Apr. 8, 1992, Ser. No. 07/865,410. Bus configuration using cross-bar switches can be carried out after the bus segments and the memory module are tested. Only good bus segments connecting to good memory modules are connected to the bus. Hence, defective segments and defective modules are isolated and they do not impose additional loading to the bus. Those skilled in the art will recognize that the anti-fuses can be replaced by other programmable switches such as EPROM or EEPROM.

Spare signal lines incorporated in the bus provide another level of defect management. Fifteen signal lines are used for the bus in all levels, however, only thirteen of them is actually required. The other two lines are used for spares. The local redundancy scheme using spare lines and special cross-bar switch are described in the co-pending patent application entitled "Circuit module redundancy architecture," filed Apr. 8, 1992, Ser. No. 07/865,410.

Defect management in the memory modules is divided into two levels. At the local level, spare rows and columns are provided for repairing defective row and columns. At the global level, identification registers and control registers are incorporated into the memory modules. These registers incorporate both nonvolatile memory elements, such as EPROM, fuses and anti-fuses, and ordinary logic circuit for both hard and soft programming. By programming the registers a defective memory module can be disabled and replaced by any good module. The identification register provides the communication address for the module. It also defines the base address of the memory cells in the module. Before the identification register is programmed, each memory module has the number 0 for its identification and they are all identical. A module is given a unique identification number only after it passes the functional tests. Alternatively, some or all of the bits in the identification code may be preprogrammed either during chip fabrication or before functional test, so long as a unique identification number can be established for each functional module in the device. Run-time replacement of defective modules can be carried out by setting the disable bit in the control register of the defective module and writing the identification number of the defective module to the identification register of a spare module. This also activates the spare module into a regular module.

In one embodiment, the memory controller occupies a separate IC die so that defective controller can be easily replaced. In another embodiment, multiple copies of the memory controller are fabricated on the same wafer, and control registers incorporating one-time or non-volatile programmable elements are used for enabling and disabling the memory controller. Any controller that passes the functional tests can be activated by setting the enable bit in its control register.

The bus in all three levels comprises fifteen signal lines with thirteen regular lines and two spare lines. The thirteen regular signal lines are divided into 2 groups. As illustrated in FIG. 4, group one contains ten signals, BusData[0:8] and clk. BusData[0:8] carries the multiplexed data, address and commands during block-mode transfers while clk carries the control timing. Both BusData[0:8] and clk are bi-directional signals which can be driven by either the memory controller or any one of the memory modules. During a block-mode transfer, the source device generates both the data and the timing signals, facilitating source synchronous transfer. A signal on the clk line is used by the destination device for latching the data into the data buffers.

Group two of the bus signals is responsible for setting up the block-mode transfers and it has three members: BusBusy# (BB#), Transmit/Receive (T/R), and TriStateControl# (TC#). They are asynchronous bus control signals. When referring to the module, BB# and T/R are input signals and TC# is a bidirectional signal.

BB# is active low. Its falling edge signals the beginning of a block transfer while its rising edge indicates the end of a transfer. The memory controller can also use this signal to abort a block transfer by driving this signal high in the middle of a transfer. T/R controls the direction of a transfer. When driven low, it sets the bus transceivers in the receive direction and the block transfer is initiated by the controller.

When driven high, T/R sets the transceivers in the transmit direction and the block transfer is sourced by a preselected memory module. TC# is active low. When driven low, it sets the bus transceivers in the high impedance (HiZ) state. When driven high, it enables the bus transceivers to buffer bus signals in the direction set by the T/R signal.

The bus, in the perspective of the communicating devices (memory modules and the controller) has four states: idle, receiving, transmitting and HiZ. They are set by the states of the three control signals as illustrated in FIG. 5. In the idle state, no bus transaction is carried out and no device participates in communication. In the receive state, the memory controller is the source device and the participating memory module is the destined device. One or more modules can be designated to receive the information. For the non-participating module, the bus sections to which they are connected are set in the HiZ state. In the transmit state, the participating module is the source device while the controller is the destined device. The bus sections connecting to the non-participating device are set in the HiZ state. Therefore to the modules not participating in the communication, the bus is in the HiZ state when it is not in the idle state. When a bus section is in the HiZ state, the bus transceivers connected to that section are set in the HiZ state and the memory module connected thereto is in standby with its bus drivers set in the HiZ state. The bus section is thus isolated from the portion of the bus connecting between the participating module and the controller. Since most of the bus transaction involves only one memory module, only a small part of the bus is in active most of time. This keeps the power consumption of and the noise-level in the system low and hence the overall system reliability high.

The bus uses asynchronous handshakes for communication control and a source-synchronous block or packet transfer for protocols. This is to simplify the clock distribution of the system and minimize the intelligence in the memory modules. Thereby, the amount of logic in the modules is minimized and the bit density of the wafer-scale memory is maximized.

Figure 6:
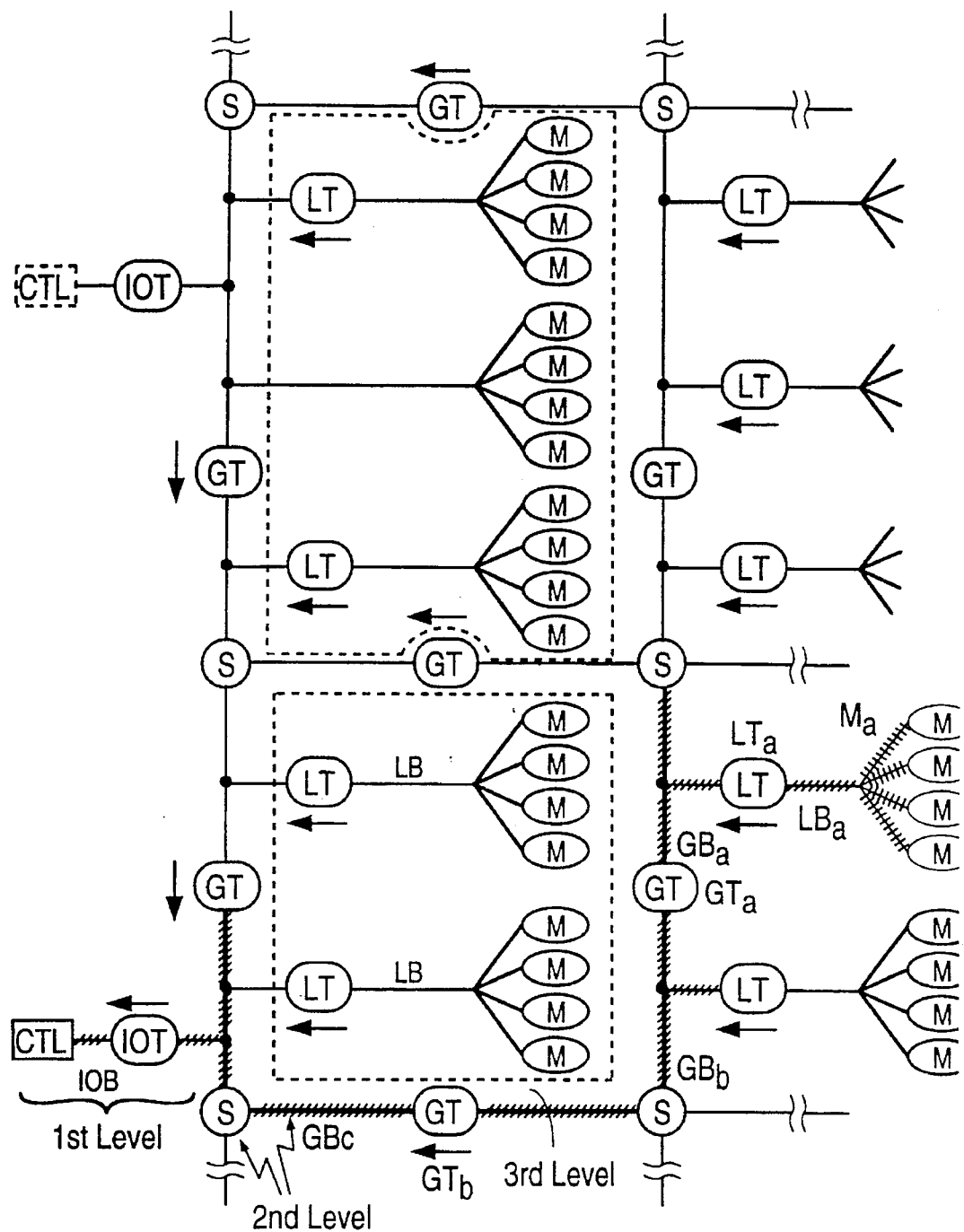
FIG. 6 is a diagram showing a bus configuration under point-to-point communication.

Asynchronous handshakes are used to initiate and terminate a block transfer. The handshake sequences are carried out using the bus control lines BB#, T/R, and TC#. Two kinds of block transfer are implemented, broadcasting and point-to-point. Broadcasting allows the controller to send command messages to all modules. Point-to-point allows only one module at a time to communicate with the controller. In point-to-point communication, only the part of the bus connecting between the controller and the participating module is activated. The rest of the bus is in HiZ state. FIG. 6 shows the configuration of the bus during a point-to-point communication. The activated path is high-lighted by hash marks; only a small portion of the bus is activated.

The handshake sequence for setting up a broadcasting transfer is carried out as follows:

(1) The controller sets all the bus transceivers to the receive direction by driving T/R low, TC# high and BB# low.

(2) The controller sends the broadcast message through the BusData lines, and transfer timing through the clk line.

(3) The controller sets the bus to the idle state by driving the BB# line high.

The handshake sequence for setting up point-to-point communication is carried out as follows:

(1) The controller sets all the bus transceivers to the receive mode by driving T/R low, TC# high and BB# low.

(2) The controller sets all the transceivers to HiZ, by driving TC# low.

(3) The controller turns around the direction of transfer on the bus by driving T/R high. All the bus transceivers remain in the HiZ state.

(4) The participating memory module drives its TC# line high, and this activates the bus portion connecting between the module and the controller while leaving the other portions of the bus in HiZ.

(5) In case the memory module is the communication source, block transfer commences. At the end of the transfer, the controller drives the BB# high, this causes all the modules to drive their TC# line high and set the bus in the idle state. In case the controller is the communication source, the controller turns around the bus by driving T/R low before entering block-mode transfer. At the end of the transfer, the controller turns around the bus once more by driving T/R high, at the same time it drives the BB# line high, this causes the module to drive their TC# signal high and the bus enters the idle state.

Step (2) requires the setting of a series of transceivers to HiZ state without the use of a separate broadcasting signal. This is accomplished with a special transceiver which sends out the broadcasting information before going to its HiZ state. The design of the transceiver is discussed in the transceiver section below. FIG. 6 illustrates the sequence of events in step (4) after memory module Ma drives its TC# line high. The arrows next to the transceivers indicates the direction which the transceivers are set. The high state of the TC# signal in module Ma activates local bus transceiver LTa which drives the TC# signal in bus segment GBa high. This in turn activates global bus transceiver GTa which subsequently drives the TC# signal in bus segment GBb high. Transceiver GTb is then activated and drives associated bus segment GBc. GBc connects to the input-output transceiver IOT which is always active during bus transactions. IOT drives the first-level bus IOB which connects between the controller and the IOT. Non-participating modules keep their bus drivers in the HiZ state. This in turn keeps the portion of TC# line connecting to them in the low state and the bus transceivers connecting to them in the HiZ state. Consequently, the portion of the bus not connecting between Ma and the controller stays in the HiZ state protocol.

Once the bus network is set up by the handshake sequences, bus transactions can be carried out using block-mode transfer in which information is transferred in blocks or packets. Two kinds of packets can be distinguished: command and data. In one embodiment, command packets are broadcasted by the controller to the whole memory subsystem. Data packets are sent using point-to-point communication. To avoid the delay of using point-to-point handshake, short data packets sent from the controller to a module can be carried out using broadcasting, which uses a shorter handshake sequence.

Figure 7:
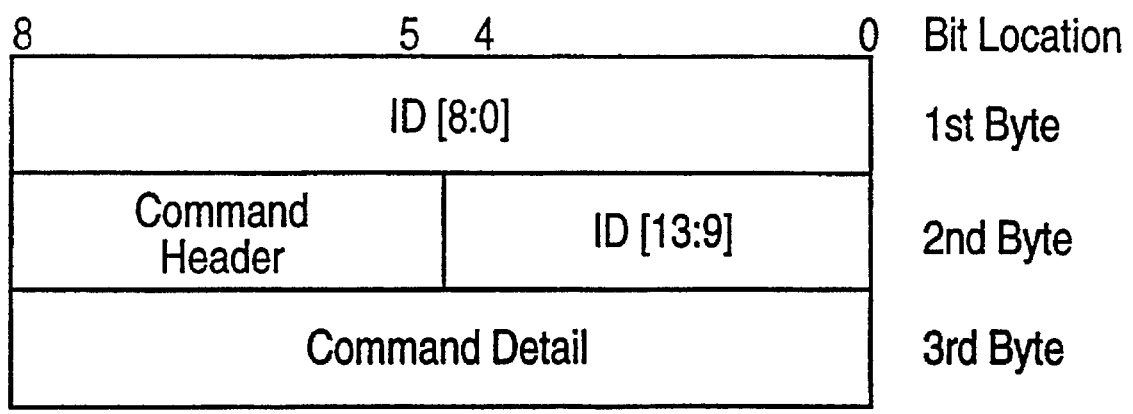
FIG. 7 shows the field definitions of a command packet.

A command packet consists of three bytes of 9 bit each. As illustrated in FIG. 7, the first byte and the five least significant bits of the second byte contain the identification (ID) number of the addressed module. The fourteen bit number allows 16K active and 16K spare memory modules to be independently addressed. The address space between the active and spare modules are distinguished by the nature of the commands. Commands intended for the active module are meaningless to the spare module, except global commands which require both type of module to perform the same tasks. Examples of commands intended for active modules are Cache Read and Cache Write. Examples for commands intended for spare modules are Identification Number Change and Module Activation. Examples of global commands are System Reset and Broadcast Write. Part of the address to the modules is therefore implicit in the command, and this implicit addressing allows more efficient use of the bits in the command packet.

The command header, encoded in the four most significant bit of the second byte in a command packet, contains the operation the designated module is instructed to perform.

The third byte of a command packet is optional. When used, it contains the additional information necessary for the module to complete the operation instructed by the command header. For instance, if the instruction is a cache read operation, then the detail information contains the address location from which the first data byte is read.

A data packet contains data arranged in bytes of 9 bits. During a block transfer, the data bytes are sent in consecutive order one at a time. The number of bytes in a packet can vary from one to 128 bytes with the upper limit imposed by the size of the cache line inside the memory module.

The format of the data packet allows efficient implementation of error detection and correction (EDC). EDC schemes used in prior art systems suffer from inefficient coding and slow memory access.

Figure 8:
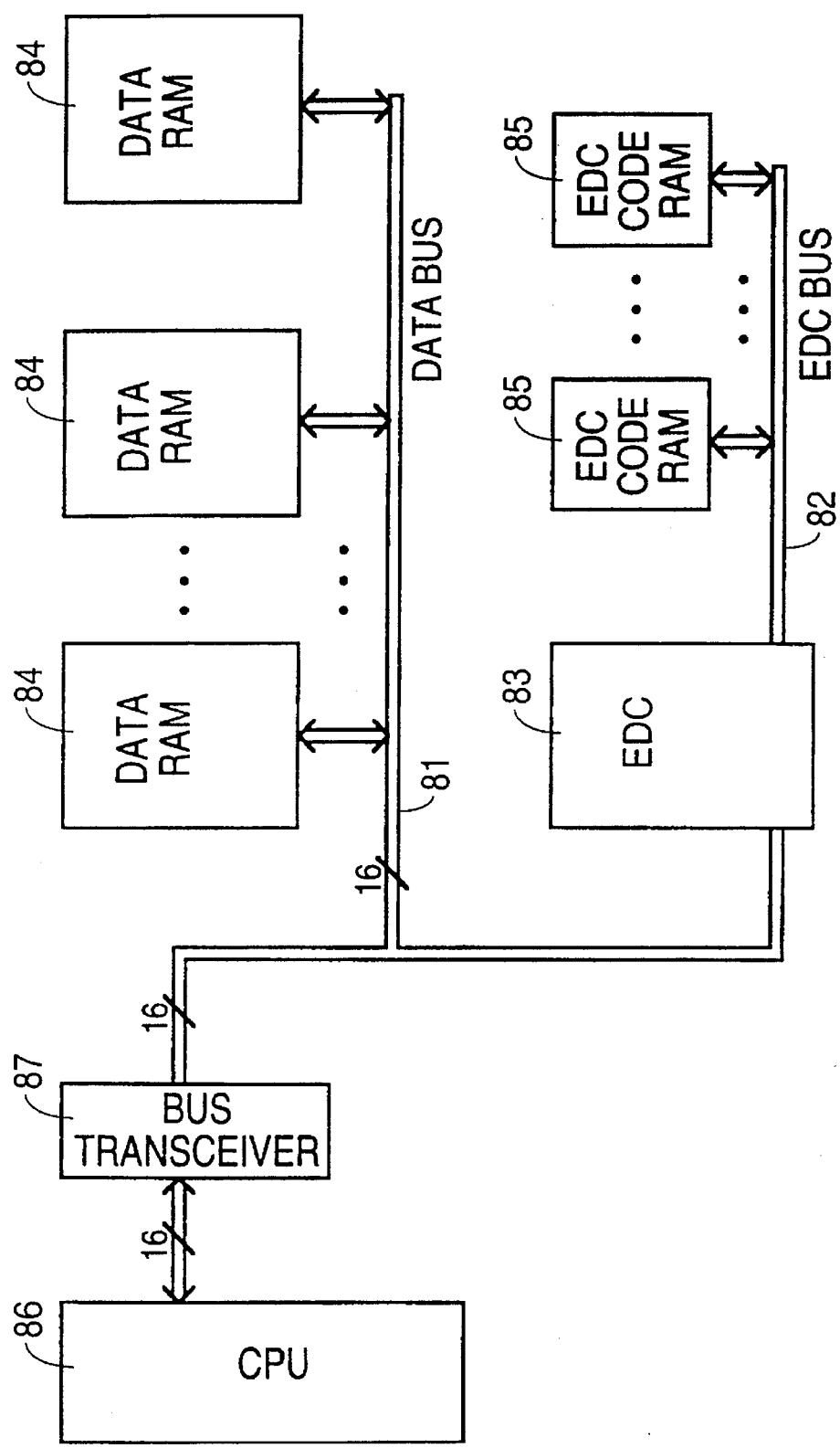
FIG. 8 is a block diagram showing the bus topology for a prior art general purpose EDC system.

FIG. 8 shows the block diagram of a prior art EDC scheme, which includes data RAMs 84, EDC code RAMs 85, system bus 81, EDC bus 82 and EDC device 83, the system bus 81 being connected to a CPU 86 via a bus transceiver 87. Each piece of data transferred in the system bus 81 is accompanied by its EDC code transferred in the EDC bus 82. The EDC device 83 inputs the data and its EDC code for error checking and correction. In this system, efficient EDC coding can be obtained at the expense of more costly large word-width buses which is also less efficient in handling partial words (bytes or 16 bit words).

According to the present invention, the 9 bit format of the data packet allows efficient implementations of EDC. Either a simple odd or even parity scheme can be used. In such scheme, 8 of the nine bits in a byte contain the data, while the other bit contains the parity. Parity encoding and decoding can be carried out in the memory controller during memory access and made transparent to the rest of the memory system. EDC can also be implemented in the system by restricting the number of bytes in the data packets to a few numbers, for examples 8. In this scheme, 8 bits in each byte can be used to carry data. The other bit in each byte can be grouped together to carry the EDC code. As illustrated in FIG. 9, for an 8-byte data packet, each byte can be used to carry 8 bits of data and 1 bit of the 8 bit EDC code. The EDC code is then distributed among the 8 bytes of the packet. Those skilled in the art may recognize that the number of bits in a byte, the number of EDC bits in a byte and the number of bytes in a data packet can be chosen rather arbitrarily. For instance, a four byte packet with each byte containing 18 bits can be used. Then two bits in each byte can be used to carry a portion of the EDC code.

Figure 10B:
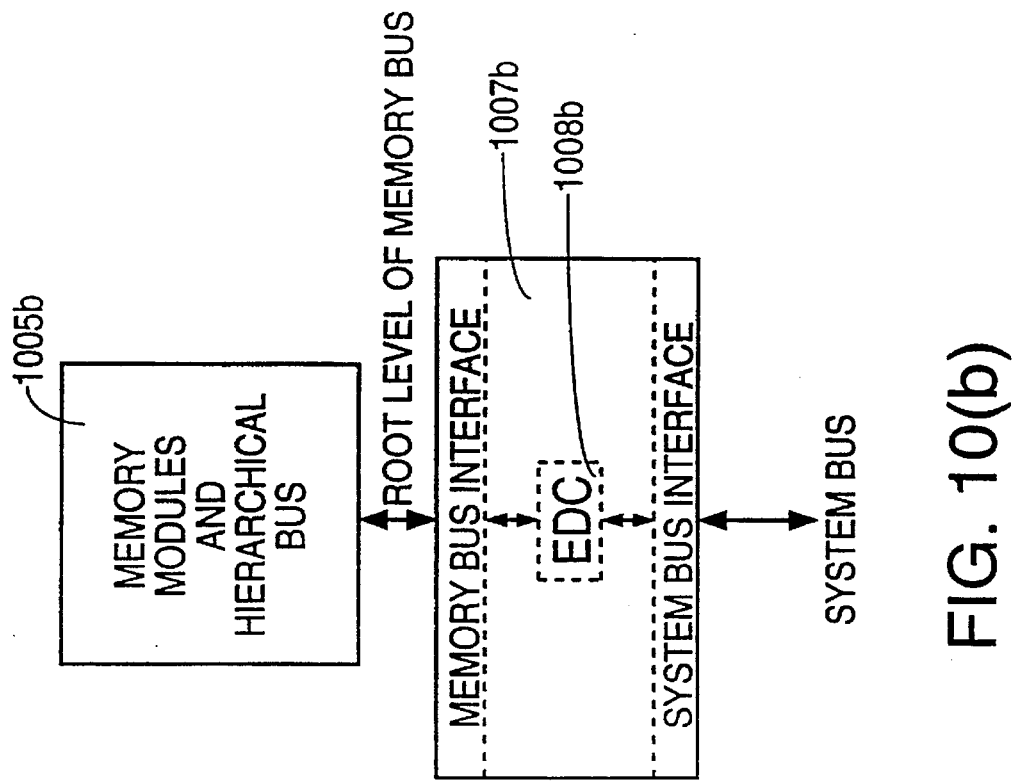
FIG. 10(b) is an implementation of EDC using flow-through technique.
Figure 10A:
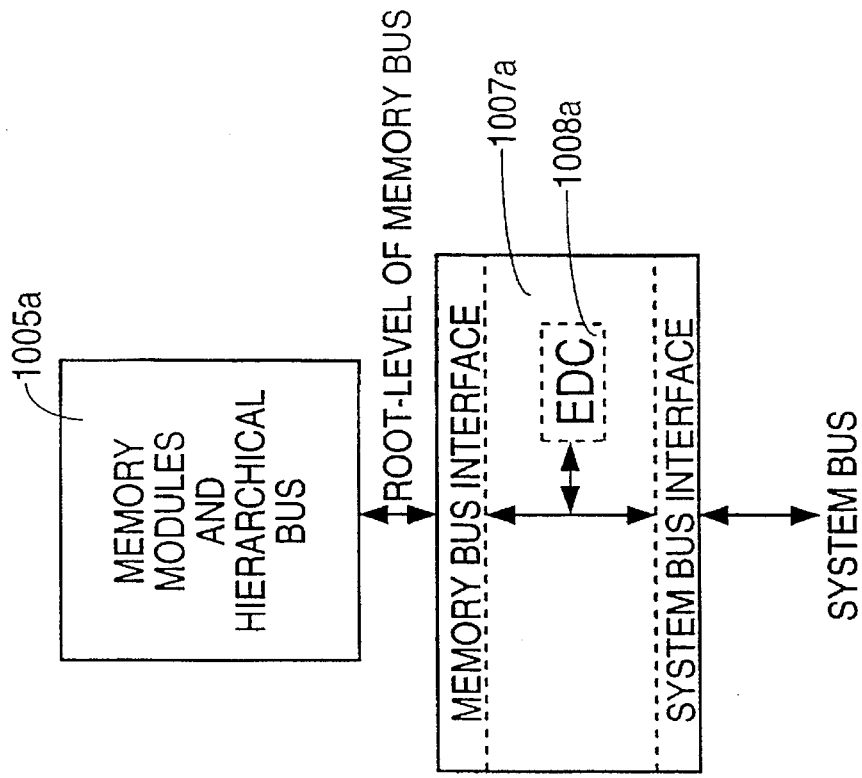
FIG. 10 consisting of FIGS. 10(a) and 10(b) is a block diagram showing in FIG. 10(a) an implementation of EDC using bus-watch technique.

EDC operations is carried out in the memory controller. FIG. 10(a) shows the block diagram of the memory system using a bus-watch EDC scheme. During a memory write operation, the memory controller 1007a assembles the data and encodes the EDC code in the data packet before sending it. The destined memory module stores both the EDC code and data indiscriminately, in other words it simply stores the whole packet in the cache or in the memory core without further data processing. During a memory read operation, the desired data packet which contains both the data and its EDC code is fetched from the memory module 1005a. After arriving at the memory controller 1007a, the EDC bit in each byte is stored away, the data portion is forwarded to the requesting device in the system. A copy of that data is sent to the EDC functional block 1008a where syndrome bits of the data are generated. Error checking and correction are carried out when the complete EDC code is obtained. In this way, EDC operations are carried out in parallel with data transfer. When no error is detected as is true most of the time, EDC operations has little effect on the memory accessing time. When an error is detected, the memory controller 1008a sets a flag in its internal register, corrects the data, write the correct data back to the memory module, and generates an interrupt to the requesting device to arrange for a data re-transmission.

In another embodiment, data received is not forwarded to the requesting device until the whole packet is received and the packet is checked and corrected for error. In this way, EDC operations are completely transparent to the requesting device as no flags need to be set and no interrupt need to be generated. A block diagram of this flow-through scheme is shown in FIG. 10(b).

Partial word write can also be handled efficiently according to the present schemes. The partial word and its address from a requested device is buffered in the controller 1008a or 1008b. The address is sent to the corresponding memory module to fetch the whole word from the memory module. The partial word is then used to replace the corresponding data in the completely word. The modified word is then written back to the memory module. The whole operation is carried out in the memory sub-system and is made transparent to the requesting devices.

The EDC scheme in accordance with the present invention is versatile as it can be fully tailored to optimize the performance of computer system with different word width and clock speed. Unlike the prior art schemes, the present invention does not waste memory storage or addressing space. Furthermore, it generates substantially less additional traffic on the system bus.

Figure 11:
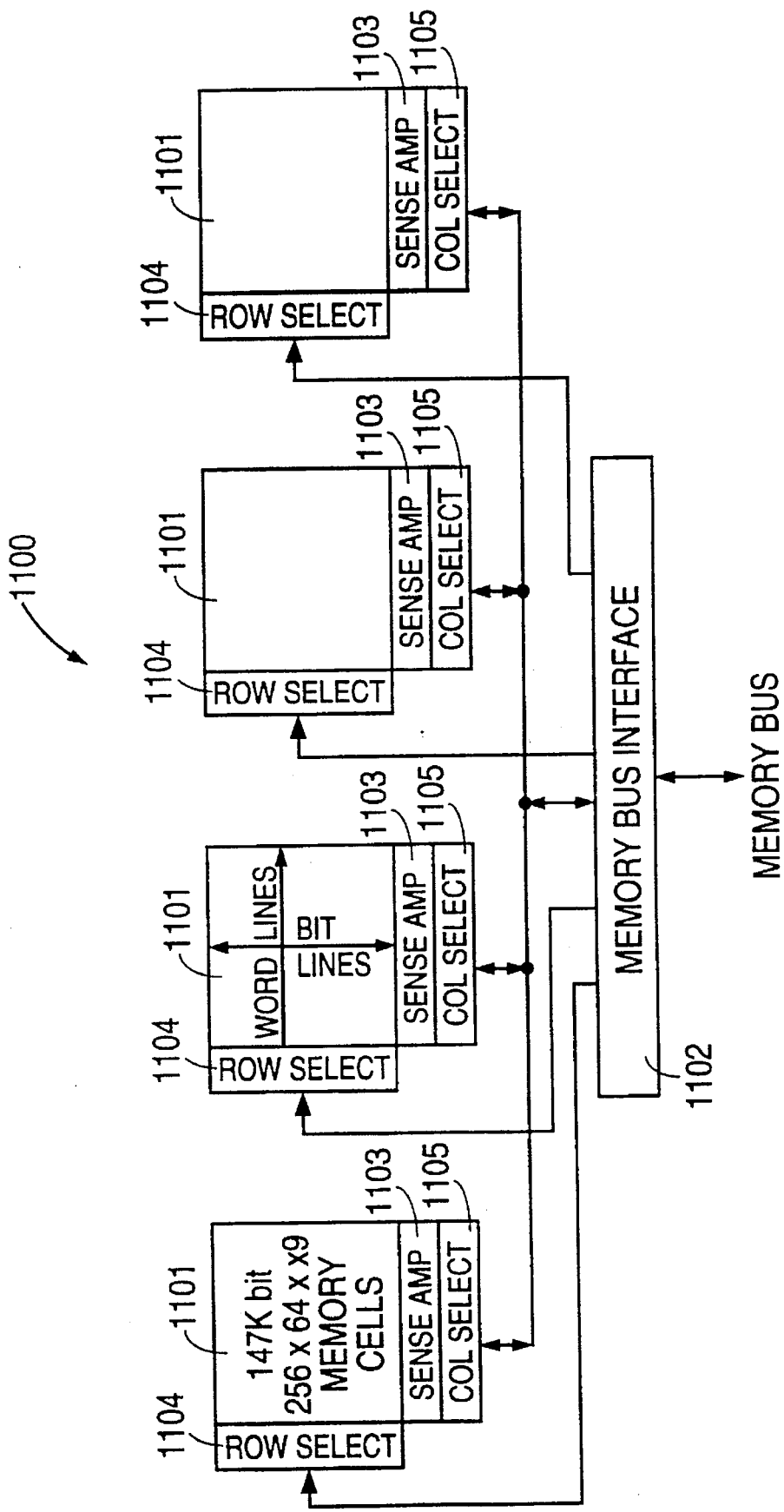
FIG. 11 is a block diagram of a memory module used in the present invention.

The memory subsystem in accordance with this invention consists of memory module connected in parallel to a hierarchical bus. As illustrated in FIG. 11, a module 1100 consists four DRAM arrays 1101 and a bus interface 1102. One skilled in the art will recognize that the memory array can be DRAM, SRAM, ROM, EEPROM or flash EPROM, and the number of arrays can be chosen rather arbitrarily. In the present embodiment, each memory array contains 147K bits configured into 256 rows of 64 bytes (9 bit). The memory array 1101 also contains 576 (64×9) sense amplifiers 1103, the row select and the column select circuitry 1104, 1105. The row select circuit 1104, when activated, enables one row of memory cells for data transfer. For memory read operation, data stored in the cells is transferred to the bit line. It is then amplified by and stored in the latched sense amplifiers 1103. Once the data is stored in the sense-amplifiers 1103, subsequent access from that row can be made directly from the sense amplifiers 1103 without going through the row select circuit 1104. Data from the sense amplifiers 1103 is selectively gated to the bus interface 1102 for output during a cache read operation. For write operation, data addressed to the row currently selected can be written directly to the sense amplifiers 1103. Data in the sense amplifier 1103 can be transferred to the memory cells using two different modes of operation: write through and write back. In the write through mode, data written to the sense amplifiers 1103 is automatically transferred to the corresponding memory cells. In the write back mode, data written to the sense amplifiers 1103 is transferred to the memory cells only when it is instructed through a memory transfer command. Write through mode requires the word line selected by the row select circuit 1104 to be activated during a write operation while write back requires the word line to be activated only when the memory is instructed.

Since access to and from the sense amplifiers is much faster (5–10 ns) than access to and from the memory cells (40–100 ns), the sense amplifiers can be used as a cache (sense-amp cache) for the memory block. Prior art systems attempted to use sense amplifiers in the DRAM as cache with limited success. Conventional DRAM because of package limitations, usually has few data input-output pins. For example, the most popular DRAM today has a configuration of X1 or X4 in which only 1 or 4 data I/O are available. Memory systems using conventional DRAM require 4 to 32 chips form a computer word (32 bits). When 4 megabit chips are used, the resultant sense-amp caches have large cache line sizes of 8K to 64K bytes but very few lines (8 to 1 lines for a 32 megabyte system). As a result, these caches have poor hit rates (50–80%). In general, a cache with over 90% hit rate requires over 100 lines irrespective of the size of the cache line. [A. Agarwal, et al, "An Analytic Cache Model," *ACM Transactions on Computer Systems,* May 1989, pp. 184–215.].

The scheme described in International Patent No. PCT/US91/02590 [Farmwald et al] managed to decrease the line size of the sense-amp cache to 1K byte when using a 4 Mega bit chip. However, in order to achieve a hit rate of over 90% for the sense amp cache, over 50 DRAM chips are required. The resultant memory systems have capacities of over 24 megabyte which it much bigger than the memory capacity (4–8 megabyte) used in most computer systems today.

One embodiment of the present invention uses a small array size of 147K bit. The resultant sense-amp cache has a line size of 64 byte. To achieve a hit rate of over 90%, the memory system is required to have a capacity of less than two megabytes which is much less than those in the prior art systems. Another feature in accordance with the present invention is not found in prior systems is that the cache line size is programmable. In systems with large memory capacity, the number of cache lines can be much more than 100. At this level, decreasing the number of cache lines has little effect on the hit rate but it can save memory storage for cache tags and speeds up the cache tag search. The number of cache lines in accordance with the present invention can be decreased by increasing the cache line size. It can be doubled from 64 byte to 128 byte by setting the cache-line-size bit in the configuration register of the memory module.

The cache system in accordance with the present invention is more flexible for system optimization and its performance is much less sensitive to the memory size than the prior art systems.

The present invention in one embodiment employs a source synchronous scheme for timing control. The clock signal which provides the timing information of the block transfer is driven by the source device from which the packet is sent. The clock signal can be the same clock which governs the internal operations of the sending device. The clock signal sent along with the communication packet is used in the receiving device to latch in the bus data. As a result, global clock synchronization is not required and the communicating devices can use totally independent clocks. In fact, the clock frequency and phase of all the communicating devices can be completely different from one another. The source-synchronous scheme avoids the problems such as phase locking and clock skew between communicating devices, which are associated with global clock synchronization and distribution. Those problems are much more difficult to handle at high frequency operations in a wafer scale environment. Skew between clock and data which limits the frequency of bus operations is minimized by matching the propagation delay in the clk and the BusData [0:8] signals. This matching includes the matching of their physical dimensions, their routing environment, their loads and their buffers. Good matching in line dimensions, signal buffers and loads is obtained by laying out the devices required to be matched identically and in close proximity of each other. The use of a relatively narrow bus (which with 10 lines needs to be critically matched) minimizes the geographical spread of the bus elements such as bus lines, bus drivers, and bus transceivers and allows the critical elements to be laid-out close to each other. The use of a fully-parallel bus structure also allows relatively easy matching of the loads on the bus lines.

Figure 12A:
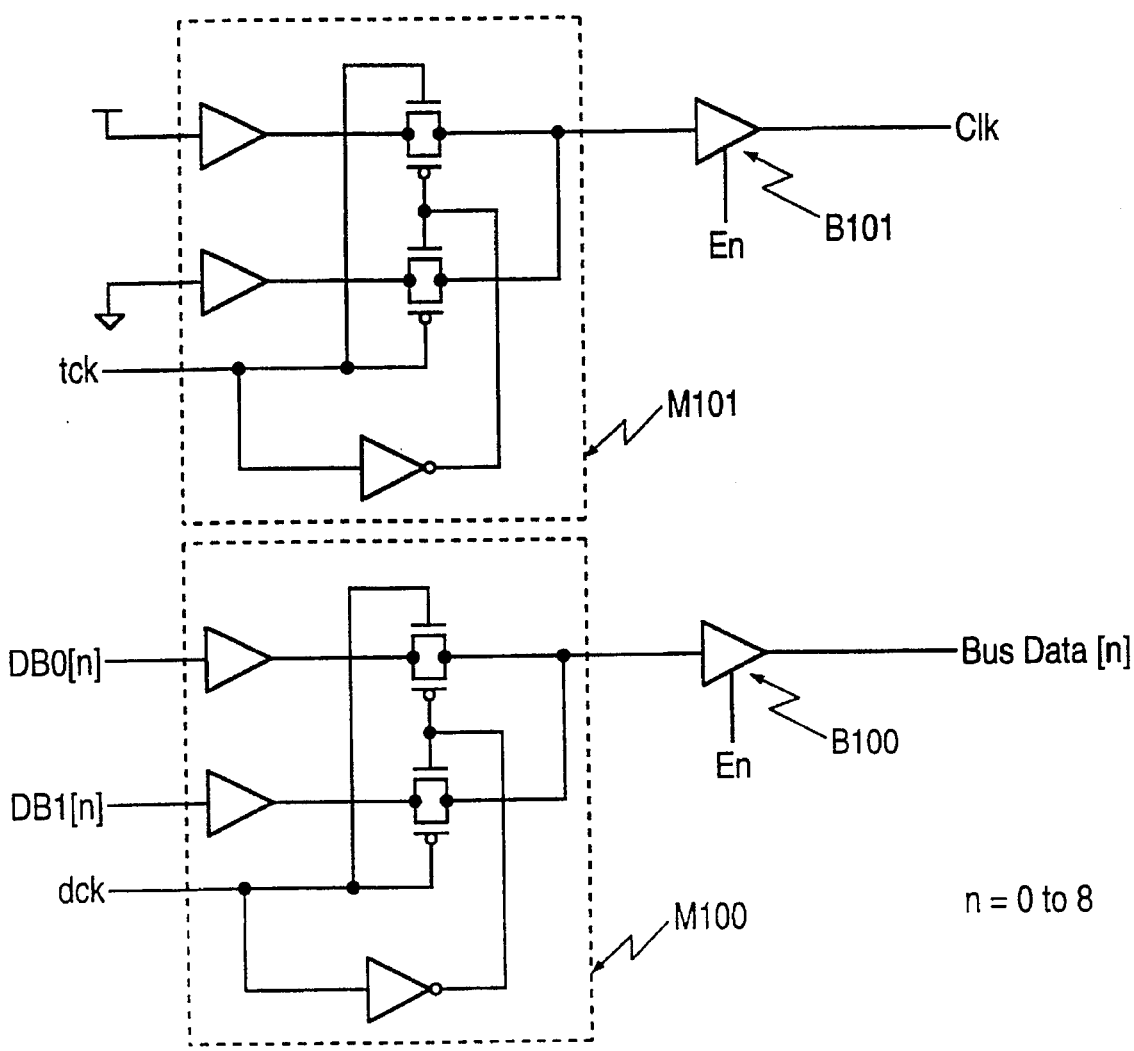
FIG. 12(a) is a schematic showing the circuit implementing dual-edge transfer; it also shows the matching circuit for the clock buffer.
Figure 12B:
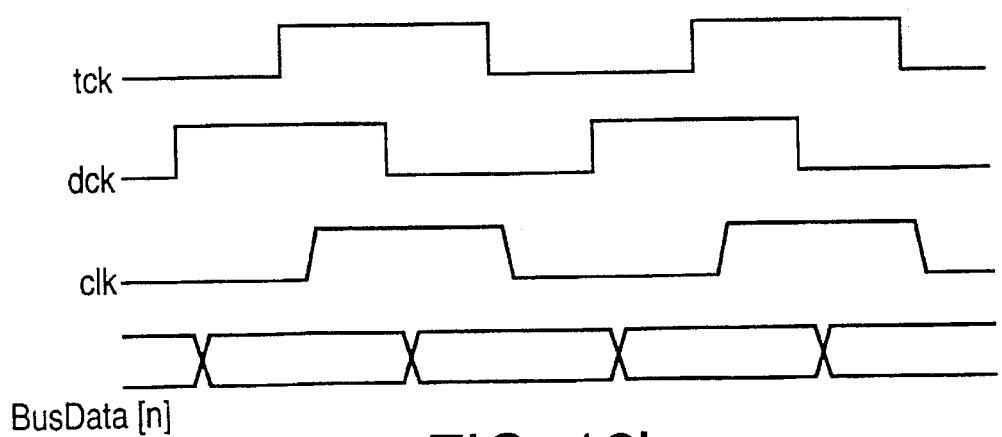
FIG. 12(b) is the timing diagram of the circuit in 12(a).

To facilitate better matching between the clk and BusData signal-path, dual-edge transfer, in which a piece of data is sent out every clock edge, is used. In dual-edge transfer, the clock frequency is equal to the maximum frequency of the data signals. Bandwidth requirements in the clock signal path therefore equal those in the data path making the matching of the signal delay in the clock and data relatively easy in the present invention. FIG. 12 illustrates the matching of the clock and data buffers in the bus interface. FIG. 12(*a*) shows a schematic of the circuit used to facilitate dual-edge transfer. Two bytes of data DB0 and DB1 are loaded to the inputs of the multiplexer M100 where, for simplicity only one bit of the data byte (bit n) is shown. The multiplexer M100 selects data byte 1 (DB0) on the positive cycle of data clock (dck) and data byte I (DB1) on the negative cycle for output. Tri-state buffer B100 buffers the data signal to the bus (BusData). The transmission clock (tck) is buffered by the multiplexer M101 and tri-state buffer B101. To match the delay in the clock and data delay, M101 and B101 have the same circuit structure as do M100 and B100 respectively. Both B100 and B101 are enabled by the signal En. To maximize the data setup and hold time for the data latches in the destined device, tck is generated so that its phase lags that of dck by 90 degree.

Figure 13:
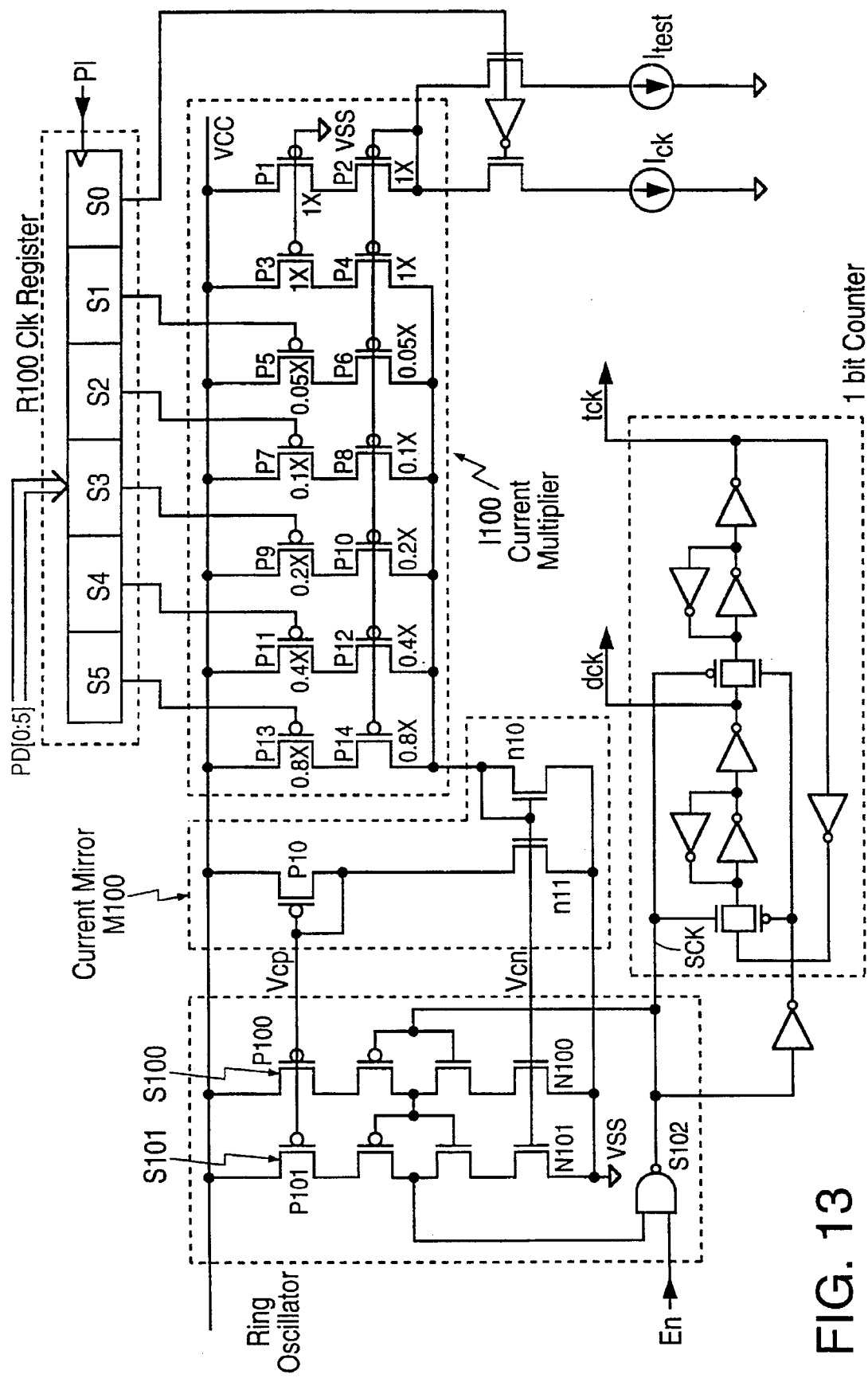
FIG. 13 is a schematic showing the circuit of the programmable clock generator.

In one embodiment clock generation is facilitated by incorporating a programmable ring oscillator in each of the communicating device. FIG. 13 shows a schematic diagram of the frequency programmable ring oscillator. It consists of two parts: a 3-stage ring oscillator and a frequency control unit. The frequency of the clock signal at output (sck) is inversely proportional to the total delay in the three delay stages S100, S101 and S102. Delay in S100 and S101 is controlled by the control voltage Vcp and Vcn which determine the drive current in transistors P100–P101 and N100–N101. Vcp and Vcn are generated by the current mirror M100 consisting the transistors N10, N11 and P10. M100 uses the output current of the current multiplier I100 as a reference to generate the control voltages Vcp and Vcn. The binary-weighted current multiplier I100, consisting of transistors P1–P14, has a current output which is equal to a constant times the value of either $I_{ck}$ or $I_{test}$ depending on the state of the select signal SO. SO has a state of zero selecting $I_{ck}$ during normal operations, and a state of one selecting $I_{test}$ during low speed tests. In the preferred embodiment, $I_{test}$ has a value approximately equal to one-fiftieth of that of $I_{ck}$. The magnitude of $I_{ck}$ is chosen so that the resultant clock frequency has a period a little longer than the delay of the longest pipeline stage inside the module. The current multiplying factor of the current multiplier is determined by the five most significant bits S1–S5 of the clock register R100.

The desired number for the multiplying constant can be loaded into the clock register through PD[0:5] and by activating the parallel load control signal P1. In a memory module, the loading occurs when the Clock-frequency-change command is executed.

Figure 14:
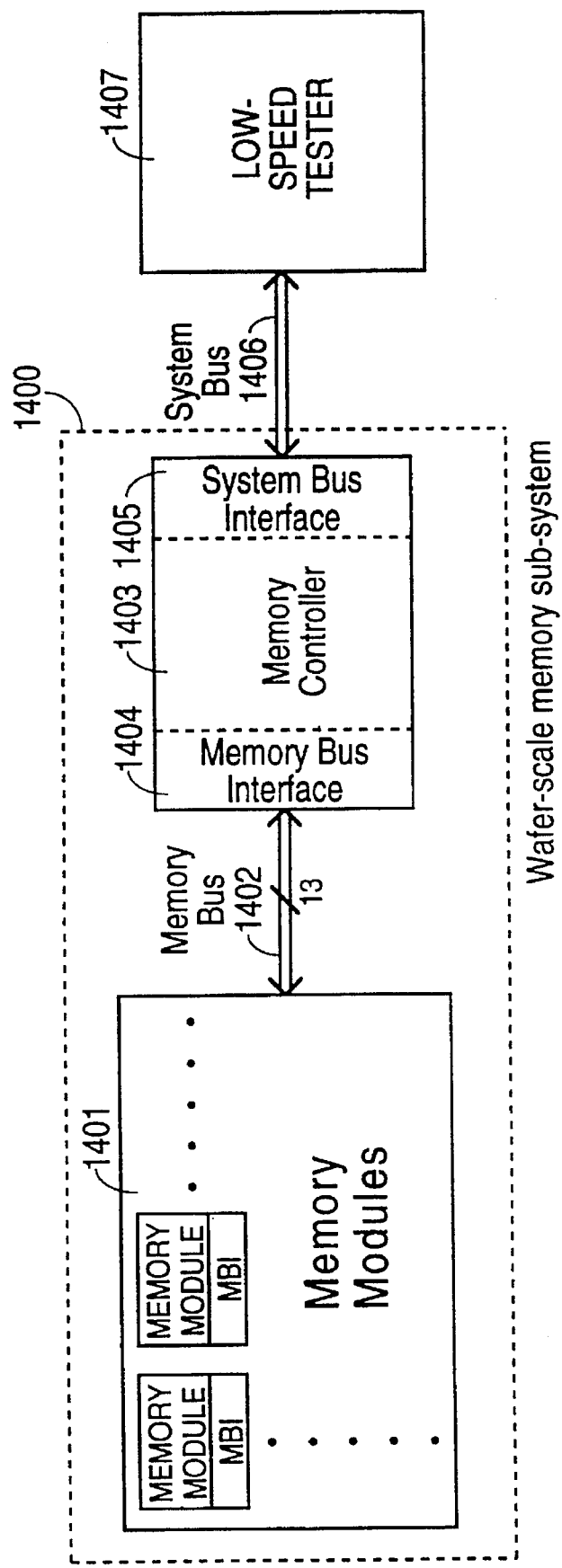
FIG. 14 is a block diagram showing the system configuration used for testing the wafer-scale memory using a relatively low speed tester.

The programmable current multiplier allows sixty-four different clock frequencies to be selected in the clock generator to meet the requirements of testing and system optimizations. The sixty-four frequencies are divided into two groups of thirty-two. One group has much lower (50x) frequencies than the other. The lower frequencies are in general used for functional or low-speed tests when the testing equipment is operating at relatively low speeds. The higher frequencies are used during normal operations and high speed tests. The fine adjustment of the clock frequency offers a relatively simple way for testing the device at speed. The 32 high-frequency levels have an increment of one twentieth of the base value. For a typical base frequency of 250 MHz which has a period of 4 ns, the frequency increment is 12.5 MHz and the clock period increment is 0.2 ns. This fine adjustment capability matches that offered by the most expensive test equipment existing today. Testing of the device at speed can be carried out by increasing the clock frequency until it fails, then the safe operating speed of the device can be set at a frequency two levels below that. As illustrated in FIG. 14, the tests can be carried out at a relatively low-speed using a relatively inexpensive tester 1407 with the tester connected only to the system bus interface 1405 of the memory controller 1403. The operating frequency of the system bus interface 1405 can be set at speed level comfortable to the tester 1407 without compromising the operation speed at the hierarchical bus 1402. All the high-speed signals of the hierarchical bus 1402 is shielded from the tester 1407. This test capability can substantially decrease the testing cost of the memory system.

The receiving device uses the clock sent by the source device to control the timing of the receiving process which is different from the internal clock that it uses for controlling its other functional blocks. Synchronization is required when data moves from the receiving unit to the other functional area inside the device. Since the read and write process do not happen simultaneously in a memory module, the receiving clock can be used to control the write process and the internal clock can be used to control the read process. In this way, no synchronization between the receiving and the internal clock is necessary.

The memory controller serves as a bridge between the memory modules and the memory requesting devices such as the CPU and DMA (Direct Memory Access) controller. It has two bus interfaces: memory and system. The memory interface connects the controller to the hierarchical or memory bus and the system interface connects the controller to the CPU and the memory requesting devices. In one embodiment, when the system bus does not use a fixed clock for communication, the method used in the memory modules for transfer synchronization is also used in the memory controller. In another embodiment, when the system bus is synchronized with a system clock, a frequency synthesizer synchronized to the system clock generates the internal clock signal of the memory controller. Synchronization between the receiving unit of the memory interface and the sending unit of the system interface uses a first-in-first-out (FIFO) memory in which the input port is controlled by the receiving clock but the output port is controlled by the system or internal clock. Flags such as FIFO empty, half-full, and full provide communications between the two bus interfaces and facilitate a more tightly coupled data transfer.

Figure 15:
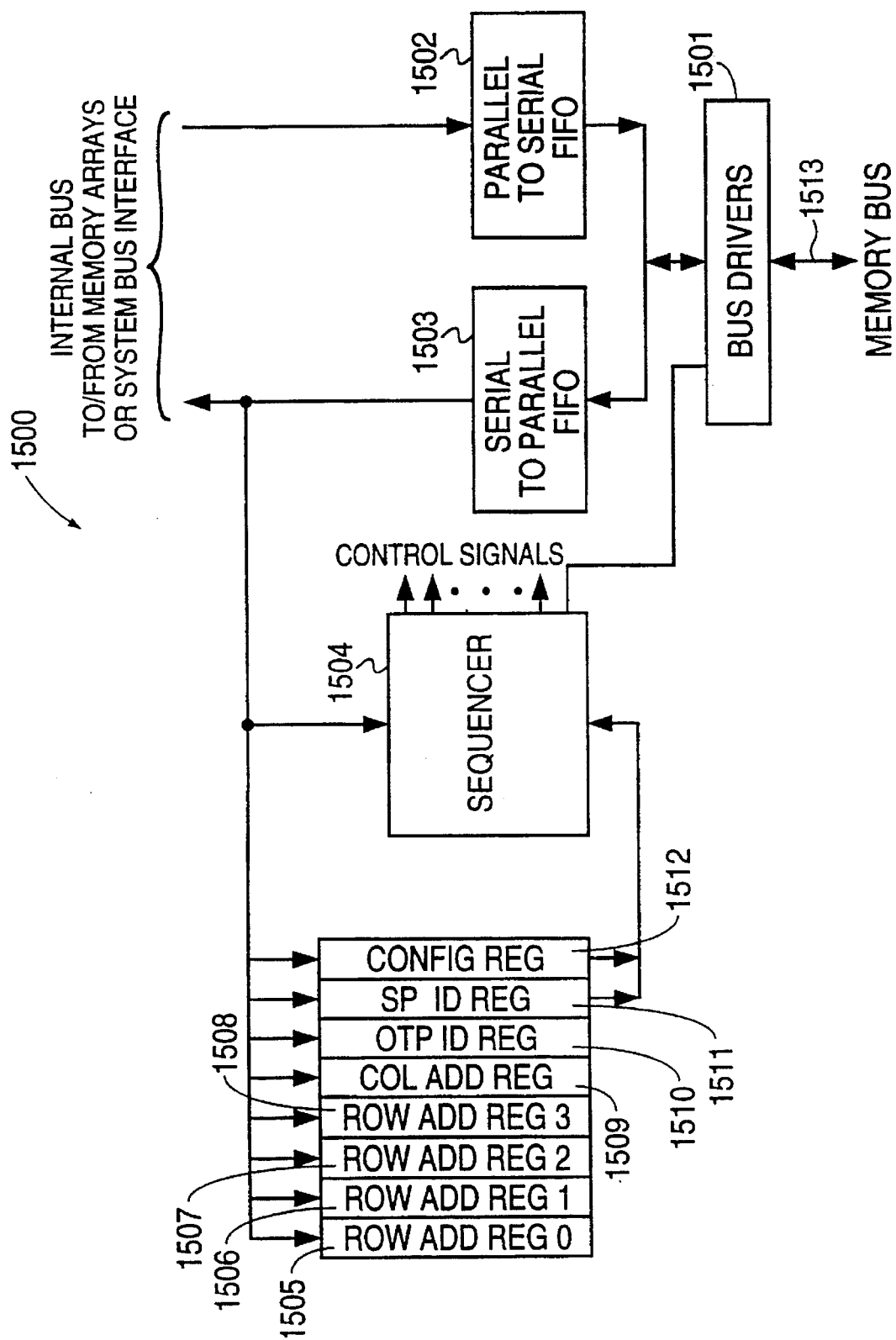
FIG. 15 is a block diagram showing the functional blocks of a memory bus interface.

The memory bus interface, connected directly to the hierarchical memory bus, is responsible for carrying out handshake sequences, encoding and decoding communication protocols, assembling and dissembling communication packets and the synchronization of data transfers. FIG. 15 shows a block diagram of the interface. It consists of the bus drivers 1501, two FIFO's 1502, 1503, eight address and control registers 1505–1512, and a sequencer 1504. This bus interface appears in the memory controller as well as in each of the memory blocks.

The bus drivers 1501 buffer the bus signals to and from the memory bus. Bi-directional tri-state drivers are used for the bidirectional signals while simple buffers are used for the unique directional asynchronous control signal.

The two FIFO's 1502, 1503 are used to match the communication bandwidth between the memory bus 1513 and the internal bus of the memory module or the memory controller. In the memory module, the sense-amp cache has an access cycle time of 5 to 10 ns which is longer than the block-mode cycle time of the memory bus (1.5–3 ns). To keep up with the transfer bandwidth, four bytes (36 bits) of data are accessed from or to the cache at a time. This requires the internal bus connecting to the sense-amp cache to be 36 bits wide and the transfer frequency is one quarter of that in the memory bus. The serial-to-parallel FIFO 1503 converts the byte serial data from the bus to 36 bit words before sending it out to the internal bus. Similarly, the parallel-to-serial FIFO 1502 serializes the data word from the sense-amp cache into data bytes before sending it out to the memory bus. In the memory controller, the word-width mismatch occurs between the memory bus and the system bus (32 to 64 bits) and the FIFO's are used to bridge it. For a synchronous system bus, the FIFO's are also used to synchronize the transfer of data between the memory bus and the system bus. To facilitate a more coherent synchronization, flags which indicate the status of the FIFO's such as empty and half-full are used.

Five address registers 1505–1509 and three control registers 1510–1512 are incorporated in the interface 1500 of a memory module. The four 8-bit row address registers 1505–1508, one dedicated for each memory block contains the addresses of the rows whose content is being cached by the sense amplifiers. The 7-bit column address register 1509 holds the base address for the current cache access. The two identification registers 1510, 1511 holds the 12 most significant bit of the communication address of the each memory block. The two least-significant bits of the communication address received in a packet is used to select one of the four modules. One-time programmable (OTP) elements, such as fuses or anti-fuses, are used in the OTP register 1510 to hold the communication address of the module for system initialization. Any nonvolatile memory elements such as EPROM and EEPROM can also be used. The OTP register 1510 are programmed in the factory after the functional tests, and only registers associated with good modules need to be programmed. The number held in the OTP identification register 1510 is transferred to the soft programmable (SP) identification register 1511 during system reset. The communication address can subsequently be changed by performing a write access to the SP identification register 1511. The identification registers 1510, 1511 provide a special way for setting up communication address in the bus system which is different from those described in the prior systems such as those described in international patent PCT/US91/02590 [Farmwald et al] and U.S. Pat. No. 4,007,452 [Hoff, Jr.], where a separate serial bus is employed. The identification registers 1510, 1511 also allow dynamic reconfiguration of the memory system in case of module failures.

Figure 16:
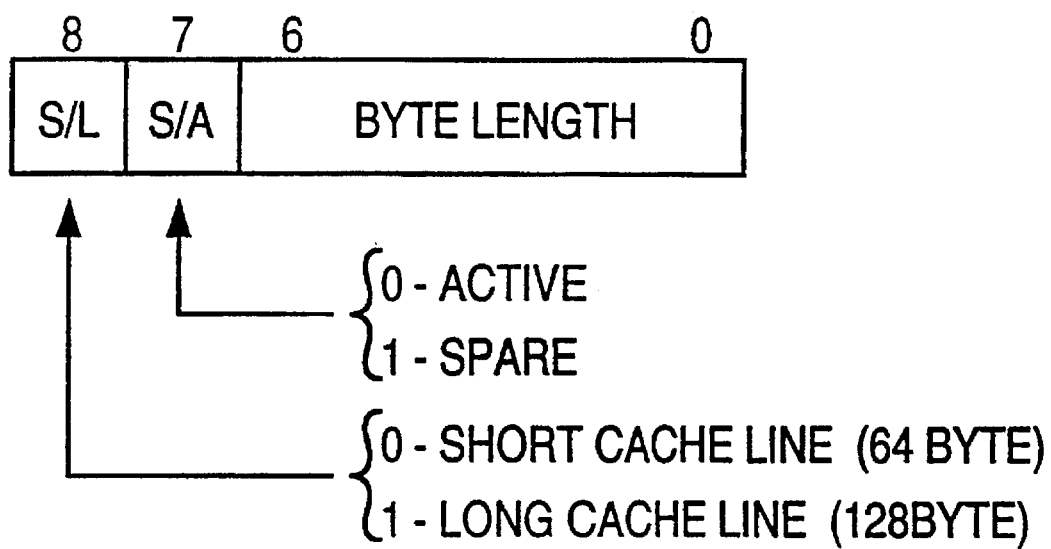
FIG. 16 shows the field definition of the configuration register in the memory bus interface.
Figure 17A:
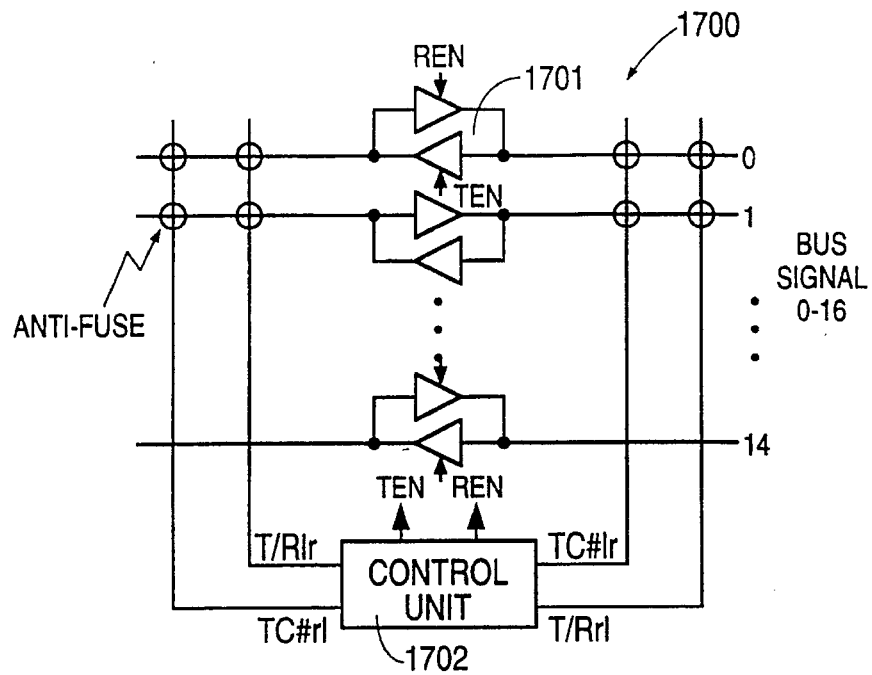
FIG. 17(a) is a block diagram.
Figure 17B:
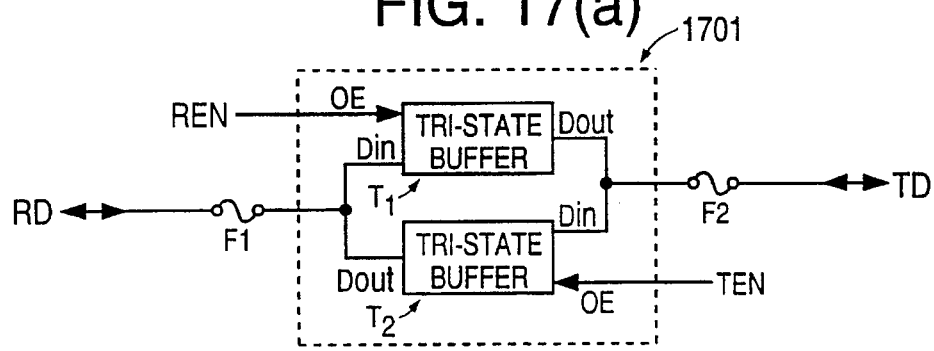
FIG. 17(b) is a bus transceiver consisting of two back-to-back bi-directional tri-state drivers.
Figure 17C:
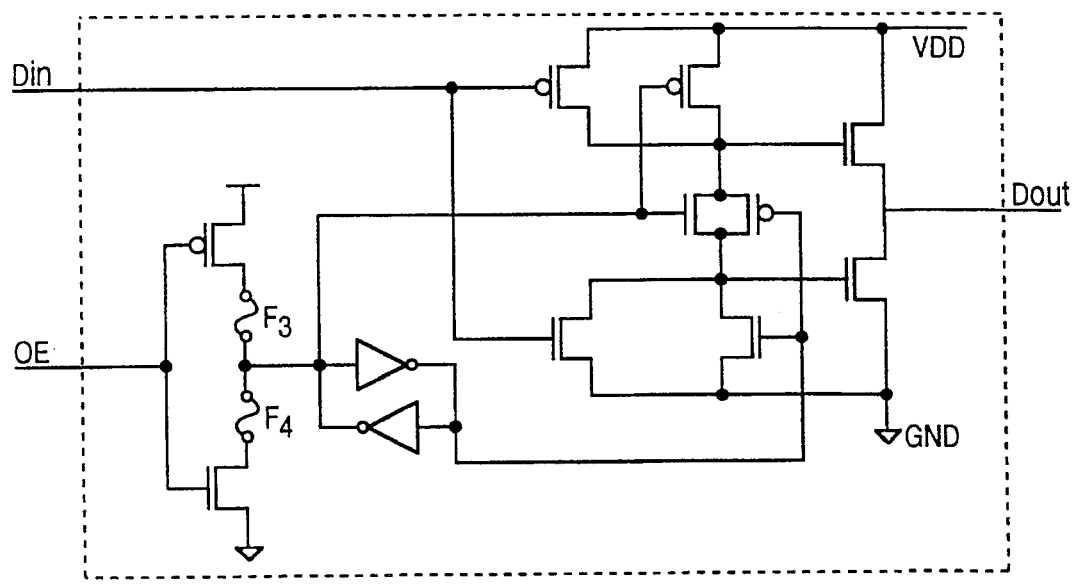
FIG. 17(c) is a circuit of the tri-state driver.
Figure 17D:
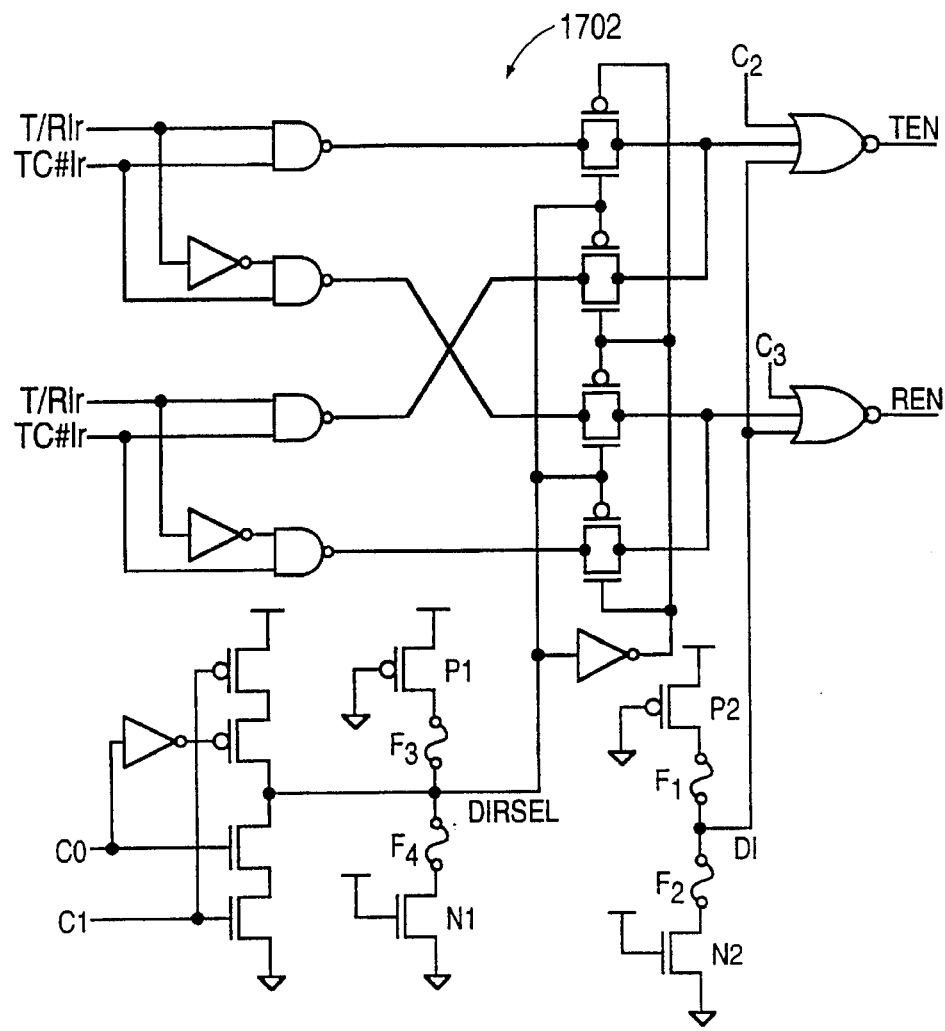
FIG. 17(d) is a circuit of the control unit.
Figure 17E:
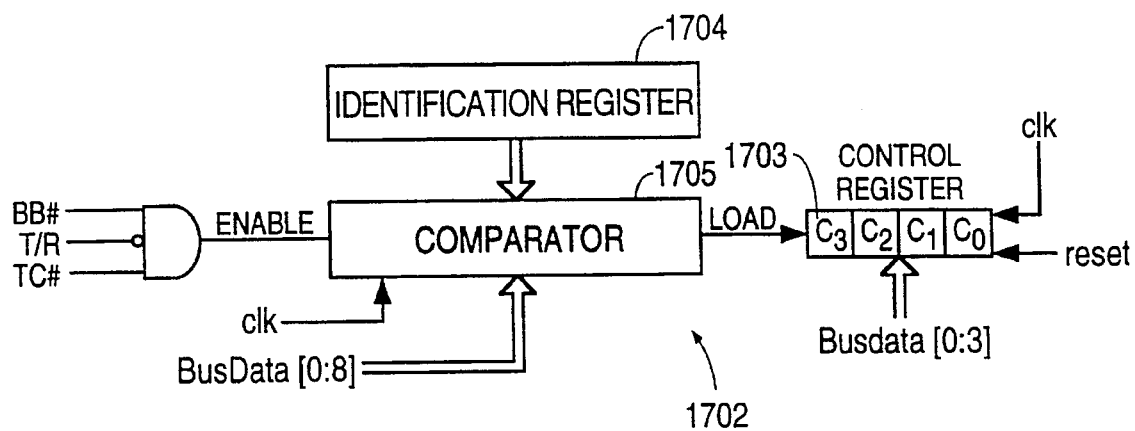
FIG. 17(e) is a block diagram showing an identification register and a control register included in the control unit.
Figure 18A:
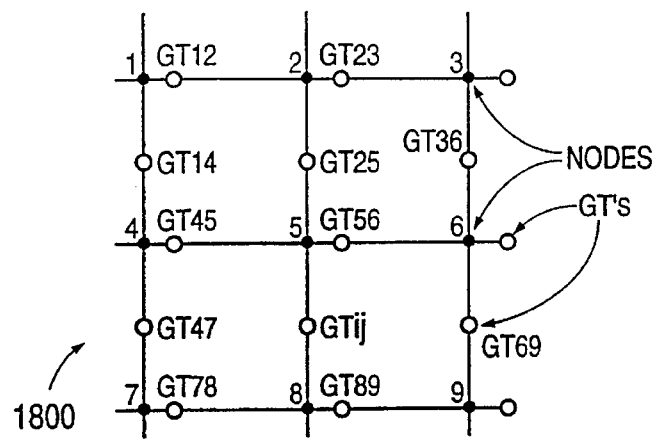
FIG. 18(a) is a section of the bus network including grids of the global bus.
Figure 18B:
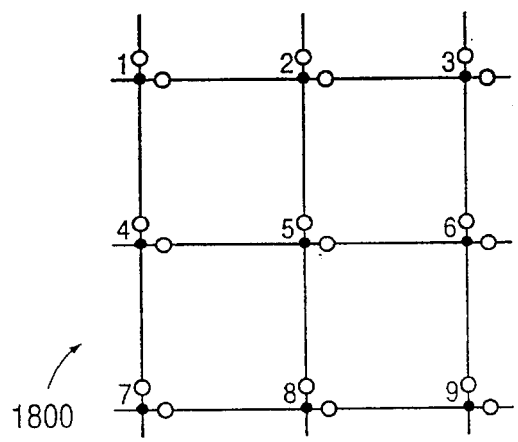
FIG. 18(b) is a Symbolic representation of the bus section in 18(a)
Figure 18C:
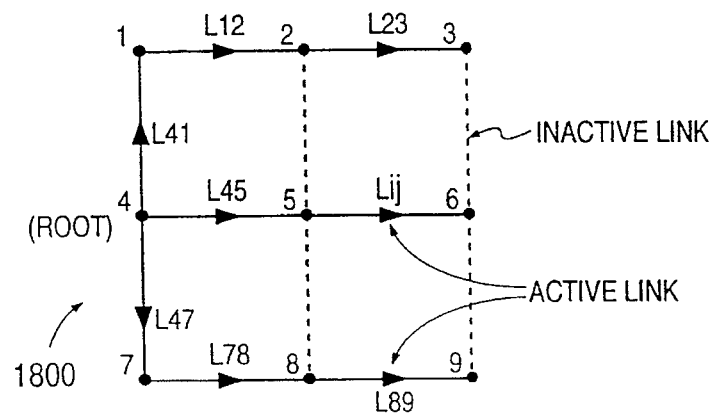
FIG. 18(c) is a Bus section of FIG. 18(a) configured to tree structure.
Figure 18D:
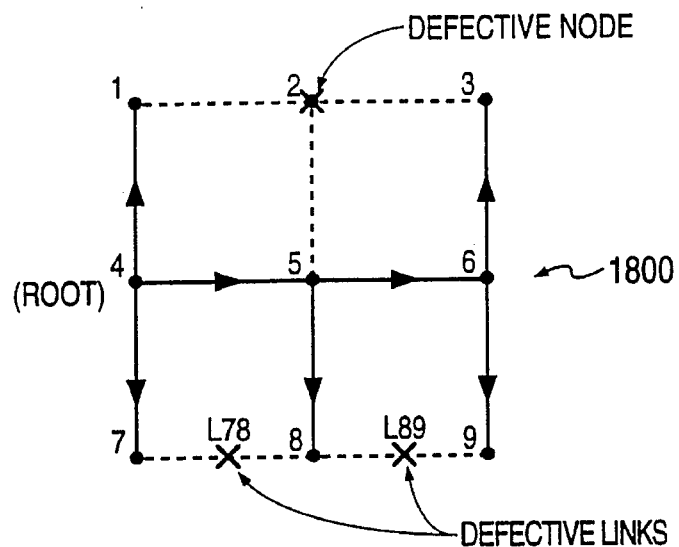
FIG. 18(d) is a Reconfiguration of the bus tree in FIG. 18(c) to isolate defects.
Figure 18E:
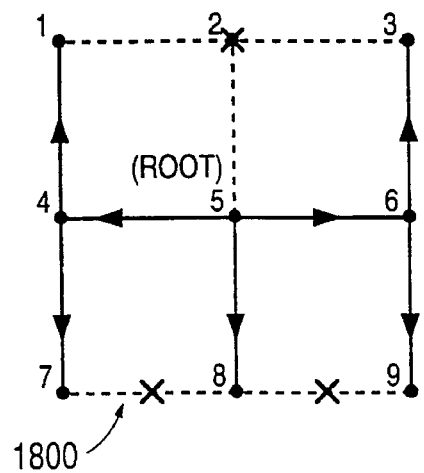
FIG. 18(e) is Reconfiguration of the bus section in FIG. 18(d) to switch the position of bus master.
Figure 18F:
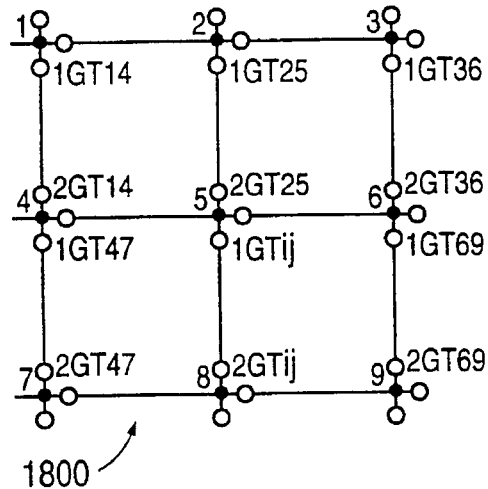
FIG. 18(f) is the bus section in FIG. 18(a) when two transceivers are incorporated in each vertical link.
Figure 18G:
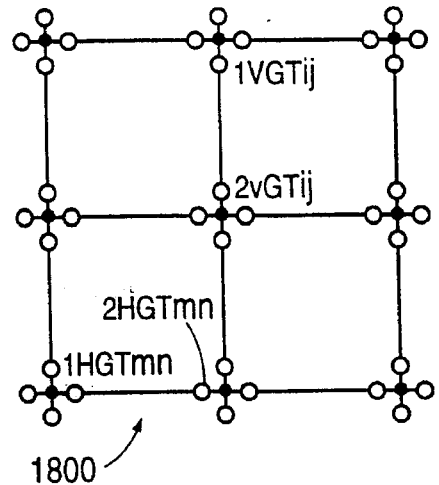
FIG. 18(g) is the bus section in FIG. 18(a) when two transceivers are incorporated in each bus link.

The 8-bit configuration register 1512, as shown in FIG. 16, contains three fields. The six least significant bits contain the byte length of the data packet used in the communication. Bit 7 of the register 1512 contains the spare/active (S/A) bit which sets the module into the corresponding state. In the spare state, the module carries out only communication configuration commands such as identification change and module reset and it is not allowed to carry out any memory access. Memory access to a module is allowed only when the S/A bit is set to 0. The most significant bit of the configuration register 1512 selects short line size (64 byte) or long line size (128 byte) for the cache. In the long cache-line mode, the content of row address registers 0 and 2 is always duplicated in row address registers 1 and 3 respectively. Also, the least significant bit of the communication address in the packet is ignored. In the short cache-line mode, the most significant bit of the column address is ignored.

In the memory controller, for a single master system, only the configuration register 1512 is incorporated in the memory interface 1500. However, in a multiple master system, both configuration register 1512 and identification registers 1510, 1511 are incorporated.

The sequencer 1504 is responsible for generating all the control signals for the operations in the interface.

BUS transceivers in all three levels of the bus hierarchy have the same basic circuit structure. FIG. 17(*a*) shows a block diagram of a bus transceiver. It consists of 15 bi-directional tri-state buffers 1701 for buffering signals in each bus line 0–14, and a control unit 1702 for enabling the outputs and controlling the direction of signal buffering 1701. All the bidirectional tri-state buffers in a transceiver have identical circuit and layout structure so that their signal propagation-delay characteristics are well matched. This minimizes the timing skews on the bus signals and it allows the substitution of a signal line by any other one for defect management. FIG. 17(*b*) shows the circuit schematic of a bi-directional tri-state buffer 1701. It consists of two back-to-back tri-state drivers $T_1$, $T_2$. The drivers $T_1$, $T_2$ are connected to the bus segment in each end through an optional fuse (F1 and F2) which provides programmability for disconnecting the tri-state buffer from the bus in case of functional failure in the buffer. The tri-state driver can also be constantly disabled (tri-stated) by blowing fuse F3 or enabled by blowing fuse F4 as shown in FIG. 17(*c*). By blowing fuse F3 in bus driver T1 and fuse F4 in driver T2, the bi-directional buffer 1701 is set to buffer only signal from the TD (right) side to RD (left) side. By blowing fuse F3 in both drivers, the bi-directional buffer 1701 is disabled and the bus segment TD is isolated from the segment RD. By disabling the transceivers attached to the two ends of a bus segment, a defective segment can be isolated from the rest of the bus network. Those skilled in the art recognize that any programmable switches can readily be used to replace the fuse elements. Under normal operations, the tri-state drivers are enabled by the control signals REN and TEN generated by the control unit. The transceiver control unit controls the direction of communication by enabling the bus driver pointing to that direction and disabling the one pointing in the Opposite direction. As illustrated in FIGS. 17(*a*) and 17(*d*), the control unit 1702 has four control input signals T/Rlr, TC#lr, T/Rrl and TC#rl connected to bus signals through anti-fuses. During network configuration, the T/Rlr and T/Rrl are programmed to connect to the T/R bus signal, and the TC#lr and TC#rl are programmed to connect to the TC# signal using the corresponding anti-fuses. Programmable switches can readily be used to replace the anti-fuses, with little effect on the system performance. Outputs TEN and REN which control the bi-directional buffers 1701 are driven deactive low by transistor P2 which has a higher drive capability than transistor N2. By blowing fuse F2, TEN and REN remains low all the time and the bi-directional buffers 1701 in the transceiver are disabled. When fuse F1 is blown, disabling signal D is driven deactive low by N2 and the output states at TEN and REN are dependent on the states of the two input pairs T/Rlr and TC#lr, and T/Rrl and TC#rl. Signal DirSel selects which input pair to assume the control of the TEN and REN. The selection is based on the position of the memory controller relative to the transceiver. The selection can be carried out by programming these fuses F3 and F4 which control the state of DirSel. For example, if the memory controller is located to the left of the transceiver, in order for the controller to have complete control of the transceiver, DirSel is set to a state of 1 by blowing fuse F4. This causes T/Rlr and TC#lr to assume the control of the bi-directional buffers 1701. Similarly, if the controller is located to the right of the transceiver, T/Rrl and TC#rl is given the control by blowing fuse F3 which sets DirSel to a state of 0. Fuses F3 and F4 can be replaced by a programmable switch with little effect on the system performance.

As shown in FIG. 17(*e*), the control unit 1702 can also incorporate a control register 1703 for bus configuration and an identification register 1704 for communication with the memory controller. The identification register 1704 includes non-volatile programmable elements which can be used to store a unique communication address assigned during the manufacturing process. The communication address allows the control register 1703 in the transceiver to be accessed by the memory controller during system initialization or system reconfiguration for enabling and disabling the transceiver. The control register 1703 contains four bits C0–C3. When C0 is set, it enables the control of the DirSel signal by C1. When CO is set, C1 overrides the effects of the fuses F3 and F4. C1 drives DirSel to the low state when it is set and to the high state when it is reset. When C2 is set, TEN is driven to the low state and the transceiver is disabled in the transmission direction. Similarly, when C3 is set, REN is driven low and the transceiver is disabled in the receiving direction. The control register 1703 is reset at power-on. To program the control register 1703, the memory controller drives the bus control signals BB# high, T/R low, and TC# high. This enables the comparator 1705 which compares the content of the BusData[0:8] in the bus with its communication address in the identification register 1704. In case of a match, the new control word from BusData[0:3] is loaded to the control register 1703 at the next clock edge.

The design of the tri-state bi-directional repeater allows the communicating devices (memory control and module) to set a series of transceivers to HiZ state without the use of a separate broadcasting signal during bus configuration. This is accomplished in the design by having the propagation delay in the tri-state buffer shorter than the input-to-output delay in the control unit. As a result, T/R and TC# signals at the inputs of the repeater are forwarded to the next transceiver before their effect on the outputs of the control unit REN and TEN is asserted.

The tri-state bi-directional repeater configuration as shown in FIGS. 17(*a,b,c,d,e*) allows the flexible implementation of communication networks that can be dynamically (or statically) re-configured or remapped for defect isolation or for passing the control of the network among several bus masters.

An exemplary network 1800 in accordance with the present invention with 9 nodes is shown in FIG. 18(*a*) where each node 1–9 represents a section of the second level of the bus (GB) architecture. For simplicity, the third level (local bus) and the circuit modules attached to it are not shown. Bus transceivers (GTij) establish the link between neighboring nodes. When the bus transceivers (GTij) are physically clustered near the vertices of the network grid, it can be represented as in FIG. 18(*b*). Symbolically, the network 1800 can also be represented as in FIG. 18(*c*) where each directional link Lij represents a bus transceiver group (GT). Not all links are used to establish a tree hierarchy; this means that the network has inherent redundancy in linking the nodes in the presence of defects. An example is shown in FIG. 18(*d*), where a tree bus hierarchy is established in the presence of multiple node and link defects 2,L78, L89.

In a network with multiple masters, the network can be remapped into many different configurations in which any of the masters can be at the root of a hierarchical tree bus structure. This capability is useful in replacing an defective master or when control of the network is passed from one master to another master. FIG. 18(*e*) shows an example of the bus mapping when the root of the hierarchical tree is at node 5 ((vs. node 4 in FIG. 18(*d*)). In this configuration the master node 5 is in control of the network instead of the master attached to node 4 as in FIG. 18(*d*). Furthermore, the network can be partitioned into many disjoint sub-networks with one master at the root of each sub-network tree. This configuration is useful for certain parallel processing applications in a multiple master environment.

The network topology in accordance with the present invention as shown in FIG. 18(*e*) is simple but powerful. The physical implementations of it may be variations from that of FIG. 18(*a,b*). For example, FIG. 18(*f*) shows an implementation with each vertical link consists of two bus transceivers (1GTij) (2GTij) and FIG. 18(*g*) shows an implementation with each vertical and horizontal link consists of two bus transceivers 1VGTij, 1VGTij, 1HGTmn, 2HGTmn. Those skilled in the art may recognize that many combinations exist as to the number of bus transceivers per link in either of the two directions.

This disclosure is illustrative and not limiting; further modifications and variations will be apparent to those skilled in the art in light of this disclosure and the appended claims.

We claim:

1. A method for communication between a communicating module in a plurality of memory modules and a memory controller through a bus system having a set of signal lines, a set of control lines, and a plurality of bus transceivers, said method comprising the steps of:

transferring bus control signals through the set of control lines to said bus transceivers using an asynchronous scheme;

operating said bus transceivers in response to said bus control signals to control directions of signal transfer on said set of signal lines;

selectively enabling said bus transceivers in response to at least one of said bus control signals, and selectively disabling said bus transceivers in response to said at least one of said bus control signals, thereby dynamically controlling the configuration of said bus system; and then using a source-synchronous scheme for transferring data, address and timing information through the set of signal lines, said timing information being driven by a source device from which the data information is sent, said timing information being used by a receiving device to latch in the data information.

2. A method as in claim 1, wherein a path on the bus system through which said data and address information pass and a path on the bus system through which said timing information passes are fully matched.

3. A method as in claim 1, wherein said information transferred according to said source-synchronous scheme is in packets.

4. A method as in claim 3, wherein said bus control signals cause said bus system to enter into one of an idle state, a receiving state, a transmitting state and a high impedance state.

5. A method as in claim 3, wherein said bus control signals comprise a bus busy control signal which indicates the beginning and end of a transfer of information, a transmit/receive control signal which controls direction of signal transfer and a high impedance control signal which enables and disables high impedance states of said bus transceivers.

6. A method as in claim 5, wherein a falling edge of said bus busy control signal indicates the beginning of a packet transfer and a rising edge of said bus busy control signal indicates the end of a transfer.

7. A method as in claim 3, wherein said packets comprise command packets and data packets.

8. A method as in claim 7, wherein said command packets are broadcast by said memory controller to said plurality of memory modules.

9. A method as in claim 7, wherein said data packets are sent using a point-to-point communication mode.

10. A method as in claim 9, wherein only a portion of said bus system that connects between said communicating module and said memory controller is activated during said point-to-point communication mode.

11. A method as in claim 1, wherein said timing information is derived from a system clock.

12. A bus system on a semiconductor device for communication between a communications module which is one of a plurality of communications modules and a bus master, said bus system comprising:

a hierarchical bus connecting said bus master and said communications modules;

a plurality of programmable bus transceivers connected to said hierarchical bus;

means for selectively enabling said bus transceivers in response to a plurality of bus control signals transmitted on said hierarchical bus, and for selectively disabling said bus transceivers in response to said plurality of bus control signals, thereby dynamically controlling the configuration of said bus system;

means for asynchronously transferring said bus control signals from said bus master to said communications module; and means for source-synchronously transferring command, data, address and clock signals between said communications module and said bus master.

13. A bus system as in claim 12, wherein said communication between said communications module and said bus master comprises at least a broadcast communication mode and a point-to-point communication mode.

14. A bus system as in claim 13, wherein only a portion of said bus system connected between said communications module and said bus master is activated during said point-to-point communication mode.

15. A bus system as in claim 12, wherein said command, data and address signals are transmitted in a packet format which includes an identification number of said communications module and an operation instruction for said communications module.

16. The bus system of claim 12, wherein each of said communications modules comprise:

a plurality of memory blocks connected to said hierarchical bus; and bus drivers connected to said hierarchical bus, said bus drivers buffering bus signals between said hierarchical bus and said memory blocks.

17. A bus system as in claim 16, wherein each of said memory blocks comprises a plurality of rows of memory cells, each of said rows having a corresponding row address, wherein a plurality of said memory blocks have a cached row of memory cells, and wherein each of said communications modules further comprises a plurality of address registers for holding row addresses for each cached row of memory cells, and an address register for holding a base address for a current cache access.

18. A bus system as in claim 16, wherein each of said communications modules further comprise a plurality of control registers for selecting, activating, and deactivating the corresponding communications module.

19. A bus system as in claim 18, wherein a first one of said control registers comprises a non-volatile memory element for storing a communication address of the corresponding communications module, and a second one of said control registers comprises a programmable register for storing a communication address of the corresponding communications module.

20. A bus system as in claim 18, wherein one of said control registers comprises a configuration register.

21. A bus system as in claim 20, wherein said configuration register comprises a spare/active bit for setting said communications module into one of a spare state and an active state, wherein memory accesses to said communications module are allowed in said active state and are prevented in said spare state.

22. A bus system as in claim 20, wherein said configuration register comprises a short/long bit for setting a length of a cache line in said communications module.

23. A bus system as in claim 20, wherein said configuration register comprises bits for indicating byte length of a data packet used in data communication.

24. A bus system as in claim 16, wherein each of said communications modules further comprise:

an internal bus coupled to said memory blocks; and two first-in first-out memory elements for matching communication bandwidth between said hierarchical bus and said internal bus.

25. A programmable bus transceiver for a hierarchical bus having a plurality of lines, comprising:

a plurality of bi-directional, tri-state buffers for buffering signals in each bus line of said hierarchical bus along one of two opposite bus directions;

an identification register for storing an address of said bus transceiver;

a comparator for comparing a current address on said hierarchical bus with the address of said bus transceiver; and a control register for enabling output of said transceiver and controlling said directions along which said signals are buffered, wherein said bus transceiver is configured in response to control signals written to said control register, and wherein said control signals are written from said hierarchical bus to said control register when said current address matches the address of said bus transceiver.

26. A bus transceiver as in claim 25, wherein said bi-directional, tri-state buffers each comprise circuits to disable said bus transceiver.

27. A bus transceiver as in claim 26, wherein said circuits comprise programmable switches.

28. A bus transceiver as in claim 25, wherein said identification register comprises a non-volatile programmable element for storing said address of said bus transceiver.

29. A transceiver as in claim 25, wherein said control register is programmable.

30. A circuit comprising:

a plurality of communicating modules;

a source device;

a bus having data paths and clock paths connecting said communicating modules and said source device; and clock frequency programming means located within each of said communicating modules for selecting a frequency of communication between at least one of said communicating modules and said source device, wherein each of said clock frequency programming means generates a clock signal having a frequency corresponding to said selected frequency of communication in response to a clock select signal transmitted from said source device to said communicating modules.

31. A circuit as in claim 30, wherein data signals are transmitted through said data paths, clock signals are transmitted through said clock paths, and said data paths and said clock paths are substantially matched to minimize skews between said data signals and said clock signals.

32. A circuit as in claim 30, wherein each said clock frequency programming means comprises a frequency-programmable ring oscillator for generating a plurality of clock signals having different frequencies.

33. A circuit as in claim 32, wherein said plurality of communicating modules are fabricated on the same chip.

34. A circuit as in claim 30, wherein said clock frequency programming means derives said clock signal from a system clock in response to said clock select signal.

* * * * *